United States Patent
Lee et al.

(10) Patent No.: US 11,948,632 B2
(45) Date of Patent: Apr. 2, 2024

(54) MEMORY DEVICE INCLUDING PHASE CHANGE MEMORY CELL AND OPERATION METHOD THEREOF

(71) Applicant: SAMSUNG ELECTRONICS CO., LTD., Suwon-si (KR)

(72) Inventors: Jungyu Lee, Hwaseong-si (KR); Hyunkook Parak, Anyang-si (KR); Jongryul Kim, Dangjin-si (KR)

(73) Assignee: Samsung Electronics Co., Ltd. (KR)

( * ) Notice: Subject to any disclaimer, the term of this patent is extended or adjusted under 35 U.S.C. 154(b) by 260 days.

(21) Appl. No.: 17/497,502

(22) Filed: Oct. 8, 2021

(65) Prior Publication Data

US 2022/0122658 A1    Apr. 21, 2022

(30) Foreign Application Priority Data

Oct. 15, 2020    (KR) .................. 10-2020-0133765

(51) Int. Cl.
*G11C 11/00* (2006.01)
*G11C 13/00* (2006.01)

(52) U.S. Cl.
CPC ...... *G11C 13/0004* (2013.01); *G11C 13/0026* (2013.01); *G11C 13/0028* (2013.01); *G11C 13/0038* (2013.01); *G11C 13/0069* (2013.01)

(58) Field of Classification Search
CPC ............ G11C 13/0004; G11C 13/0026; G11C 13/0028; G11C 13/0038; G11C 13/0069; G11C 13/0061; G11C 2013/0078; G11C 2013/0092; G11C 2213/15; G11C 2213/76; G11C 13/003; G11C 13/0097; G11C 13/0002; G11C 8/10; G11C 13/0007

See application file for complete search history.

(56) References Cited

U.S. PATENT DOCUMENTS

| 6,801,456 | B1 * | 10/2004 | Hsu ................... G11C 16/10 365/185.27 |
|---|---|---|---|
| 7,436,693 | B2 | 10/2008 | Kang et al. |
| 7,577,023 | B2 | 8/2009 | Philipp et al. |
| 7,643,373 | B2 | 1/2010 | Sheu et al. |
| 8,116,125 | B2 | 2/2012 | Kim et al. |
| 8,406,044 | B2 | 3/2013 | Kim |
| 9,153,320 | B2 | 10/2015 | Franklin et al. |
| 9,208,865 | B2 | 12/2015 | Sugimae et al. |
| 9,779,813 | B2 | 10/2017 | Lung et al. |
| 10,373,682 | B2 | 8/2019 | Parkinson et al. |
| 2008/0165569 | A1 | 7/2008 | Chen et al. |
| 2009/0027975 | A1 | 1/2009 | Kang et al. |
| 2011/0069540 | A1 | 3/2011 | Savransky |

(Continued)

*Primary Examiner* — Hien N Nguyen
(74) *Attorney, Agent, or Firm* — Fish & Richardson P.C.

(57) ABSTRACT

A memory device includes a phase change memory (PCM) cell connected between a bit line and a word line. An X-decoder provides a word line voltage to the word line during a reset operation, and a Y-decoder provides a bit line voltage to the bit line during the reset operation. A voltage bias circuit generates the word line voltage and the bit line voltage based on a first bias during a first period of the reset operation, the word line voltage and the bit line voltage based on a second bias greater than the first bias during a second period of the reset operation, and the word line voltage and the bit line voltage based on a third bias smaller than the first and second biases during a third period of the reset operation.

10 Claims, 17 Drawing Sheets

(56) References Cited

U.S. PATENT DOCUMENTS

| | | |
|---|---|---|
| 2012/0033480 A1 | 2/2012 | Hosono et al. |
| 2012/0087188 A1* | 4/2012 | Hsieh ................. G11C 16/3418 |
| | | 365/185.23 |
| 2013/0077376 A1* | 3/2013 | Kim ....................... G11C 17/18 |
| | | 365/104 |
| 2016/0267995 A1* | 9/2016 | Chang ................ G11C 16/0475 |
| 2018/0374540 A1* | 12/2018 | Hwang .................. G11C 16/10 |
| 2020/0051632 A1 | 2/2020 | Park |
| 2020/0098425 A1 | 3/2020 | Mori et al. |

\* cited by examiner

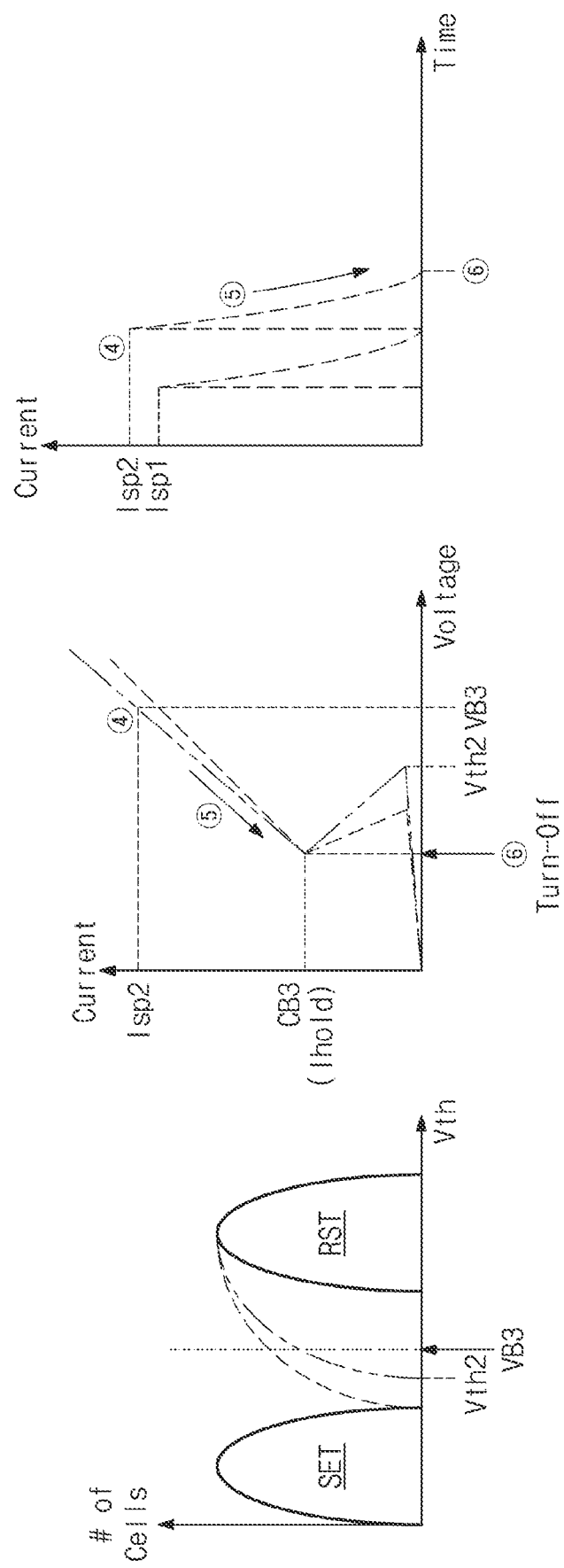

MEMORY DEVICE INCLUDING PHASE CHANGE MEMORY CELL AND OPERATION METHOD THEREOF

CROSS-REFERENCE TO RELATED APPLICATIONS

This application claims priority under 35 U.S.C. § 119 to Korean Patent Application No. 10-2020-0133765 filed on Oct. 15, 2020, in the Korean Intellectual Property Office, the disclosure of which is incorporated by reference herein in its entirety.

BACKGROUND

Embodiments of the present disclosure described herein relate to a semiconductor memory, and more particularly, relate to a memory device including a phase change memory cell and an operation method thereof.

A semiconductor memory is classified as a volatile memory, in which stored data disappear when power is turned off, such as a static random access memory (SRAM) or a dynamic random access memory (DRAM), or a non-volatile memory, in which stored data are retained even when power is turned off, such as a flash memory, a phase change RAM (PRAM), a magnetic RAM (MRAM), a resistive RAM (RRAM), or a ferroelectric RAM (FRAM).

For example, a phase change memory (PCM) stores data by using a physical characteristic of a phase change material (e.g., GST). The phase change material may have a crystalline state or an amorphous state, and a state of the phase change material may be changed by controlling a magnitude of a current provided to the phase change material or a time during which the current is applied to the phase change material. A large write current is necessary to change a state of the phase change material from the crystalline state to the amorphous state. The large write current causes the degradation of the phase change memory or makes a distribution of high-speed cells worse.

SUMMARY

Embodiments of the present disclosure provide a memory device including a phase change memory cell having improved lifetime and improved reliability and an operation method thereof.

According to an embodiment, a memory device includes a first phase change memory cell that is connected with a first bit line and a first word line. An X-decoder provides a selection word line voltage to the first word line during a reset write operation for changing a state of the first phase change memory cell from a set state to a reset state. A Y-decoder provides a selection bit line voltage to the first bit line during the reset write operation. A voltage bias circuit generates the selection word line voltage and the selection bit line voltage based on a first voltage bias during a first period of the reset write operation, generates the selection word line voltage and the selection bit line voltage based on a second voltage bias greater than the first voltage bias during a second period of the reset write operation, and generates the selection word line voltage and the selection bit line voltage based on a third voltage bias smaller than the first voltage bias and the second voltage bias during a third period of the reset write operation.

According to an embodiment, an operation method of a memory device which includes a phase change memory cell includes: (1) applying a first voltage bias to a bit line and a word line, which are connected with the phase change memory cell, during a first period of a reset write operation for writing the phase change memory cell to a reset state, (2) applying a second voltage bias greater than the first voltage bias to the bit line and the word line connected with the phase change memory cell during a second period of the reset write operation after the first period, and (3) applying a third voltage bias equal to or smaller than the first voltage bias to the bit line and the word line connected with the phase change memory cell during a third period of the reset write operation after the second period.

According to an embodiment, an operation method of a memory device which includes a phase change memory cell includes turning on the phase change memory cell, applying a reset write current to the phase change memory cell, and applying at least one current pulse to the phase change memory cell. While the at least one current pulse is applied to the phase change memory cell, a voltage of a bit line connected with the phase change memory cell and a voltage of a word line connected with the phase change memory cell are uniformly maintained.

According to an embodiment, an operation method of a memory device, which includes a plurality of phase change memory cells connected to a plurality of bit lines and a plurality of word lines, includes: (1) selecting a target memory cell of the plurality of phase change memory cells, (2) applying a first voltage bias to a target bit line connected with the target memory cell from among the plurality of bit lines and a target word line connected with the target memory cell from among the plurality of word lines, during a first period of a reset write operation for changing a state of the target memory cell to a reset state, (3) applying a second voltage bias greater than the first voltage bias to the target bit line and the target word line, during a second period of the reset write operation after the first period, and (4) applying a third voltage bias equal to or smaller than the first voltage bias to the target bit line and the target word line during a third period of the reset write operation after the second period.

BRIEF DESCRIPTION OF THE FIGURES

The above and other objects and features of the present disclosure will become apparent by describing in detail embodiments thereof with reference to the accompanying drawings.

FIGS. 9A to 9C are distribution diagrams, current-voltage graphs, and timing diagrams for describing operation S130 of FIG. 5.

DETAILED DESCRIPTION

Below, embodiments of the present disclosure may be described in detail and clearly to such an extent that one skilled in the art easily implements the present disclosure.

Figure 1:
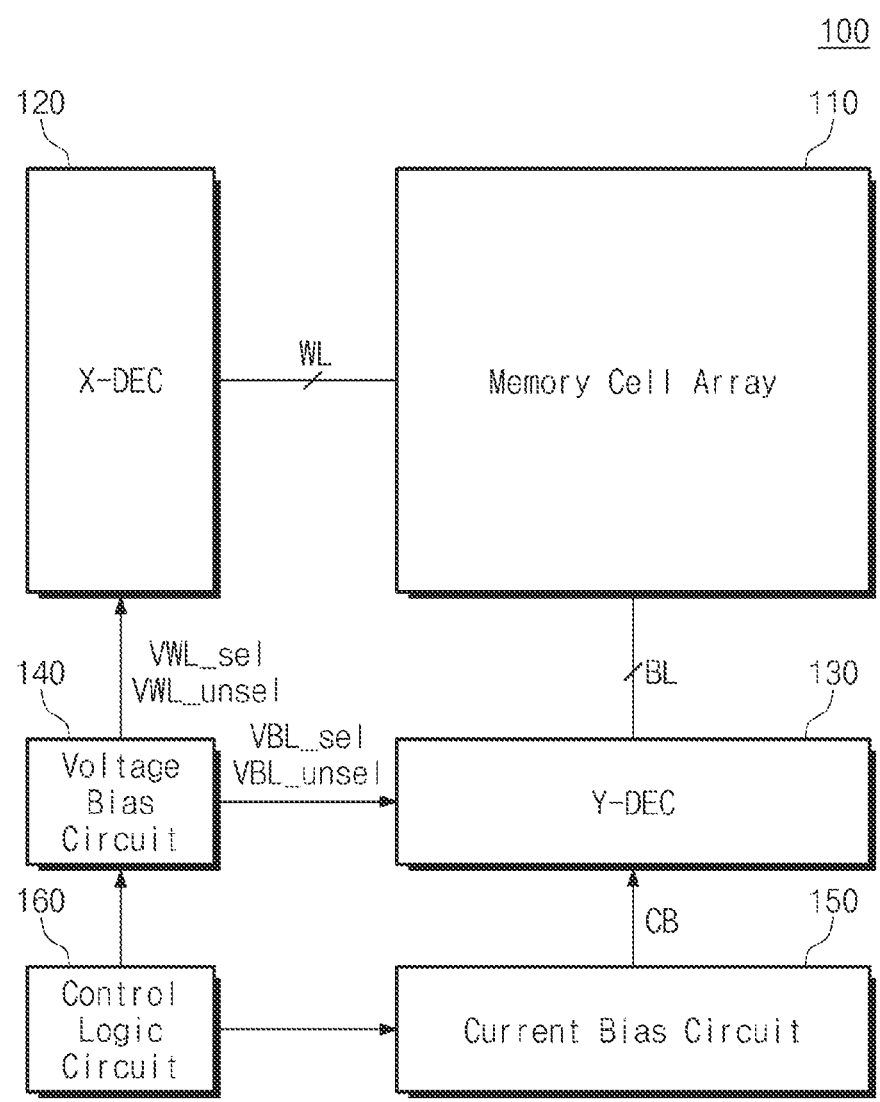
FIG. 1 is a block diagram illustrating a memory device according to an embodiment of the present disclosure.

FIG. 1 is a block diagram illustrating a memory device according to an embodiment of the present disclosure. Referring to FIG. 1, a memory device 100 may include a memory cell array 110, a row decoder (X-DEC) (hereinafter referred to as an "X-decoder") 120, a column decoder (Y-DEC) (hereinafter referred to as a "Y-decoder") 130, a voltage bias circuit 140, a current bias circuit 150, and a control logic circuit 160.

The memory cell array 110 may include a plurality of memory cells. The plurality of memory cells may be connected with word lines WL and bit lines BL.

The X-decoder 120 may be connected with the memory cell array 110 through the plurality of word lines WL. The X-decoder 120 may be configured to control voltage levels of the plurality of word lines WL. For example, the X-decoder 120 may select at least one of the plurality of word lines WL, may provide a selection word line voltage VWL_sel to the selected word line, and may provide a non-selection word line voltage VWL_unsel to unselected word lines.

The Y-decoder 130 may be connected with the memory cell array 110 through the plurality of bit lines BL. The Y-decoder 130 may be configured to control voltage levels of the plurality of bit lines BL. For example, the Y-decoder 130 may select at least one of the plurality of bit lines BL, may provide a selection bit line voltage VBL_sel to the selected bit line, and may provide a non-selection bit line voltage VBL_unsel to unselected bit lines.

The voltage bias circuit 140 may be configured to generate various voltages necessary for the memory device 100 to operate. For example, the voltage bias circuit 140 may be configured to generate various voltages such as the selection word line voltage VWL_sel, the non-selection word line voltage VWL_unsel, the selection bit line voltage VBL_sel, and the non-selection bit line voltage VBL_unsel. In an embodiment, the above-described voltages may be voltages that are used in a write operation of the memory device 100 (in particular, an operation of changing memory cells from a set state to a reset state, an operation of writing memory cells to the reset state, or a reset operation associated with memory cells). However, the present disclosure is not limited thereto. For example, the voltage bias circuit 140 may be configured to generate various voltages that are used in other operations for memory cells, such as a read operation and a set operation.

The current bias circuit 150 may be configured to generate a current bias CB. The current bias CB may be used to restrict or control a magnitude of a current flowing through the bit line BL in a write operation (in particular, a reset write operation) of the memory device 100. For example, the Y-decoder 130 may restrict a current flowing through a selected bit line to a magnitude of the current bias CB. In an embodiment, the current bias CB may have a magnitude that is determined in advance depending on a physical characteristic of memory cells. The current bias CB will be more fully described with reference to the following drawings.

The control logic circuit 160 may be configured to control overall operations of the memory device 100. For example, the control logic circuit 160 may be configured to control the voltage bias circuit 140 and the current bias circuit 150 for the purpose of writing data in the memory cell array 110.

In an embodiment, the memory device 100 according to an embodiment of the present disclosure may be a phase change memory (PCM) device. That is, the memory cell array 110 may include phase change memory (PCM) cells. However, the present disclosure is not limited thereto. For example, like a resistive memory (ReRAM), the memory device 100 may include memory elements that allow threshold voltages or resistance values of memory cells to be variable depending on a write current. Below, for convenience of description, it is assumed that the memory device 100 includes a phase change memory.

A phase change memory cell may have a set state or a reset state depending on a magnitude of a threshold voltage Vth. That is, data may be written in the phase change memory cell by adjusting a magnitude of a threshold voltage of the phase change memory cell. Below, to describe the present disclosure easily, it is assumed that the memory device 100 according to an embodiment of the present disclosure performs an operation of changing states of memory cells from the set state to the reset state (hereinafter, the operation being referred to as a "reset operation" or a "reset write operation" for a memory cell). However, the present disclosure is not limited thereto.

In general, a large write current is used in the reset write operation for a memory cell. In this case, because a large write current flows to a memory cell, memory cells may be degraded. In contrast, in the case where the magnitude and the time of a write current used in the reset operation are not sufficient, because threshold voltages of memory cells are not normally changed, a read margin for the memory cells (i.e., a difference between a threshold voltage distribution of the set state and a threshold voltage distribution of the reset state) may not be secured. That is, the reliability of the memory device 100 may be reduced.

The memory device 100 according to an embodiment of the present disclosure may be configured to apply a plurality of current pulses (or spike currents) to target memory cells in the reset write operation. In this case, because a large write current is not used during a long time, the degradation of memory cells may be reduced, and a read margin for the memory cells (i.e., a difference between a threshold voltage distribution of the set state and a threshold voltage distribution of the reset state) may also be secured. Accordingly, a memory device with improved reliability and improved lifetime is provided. The write operation (i.e., the reset write operation) of the memory device 100 according to an embodiment of the present disclosure will be more fully described with reference to the following drawings.

Figure 2:
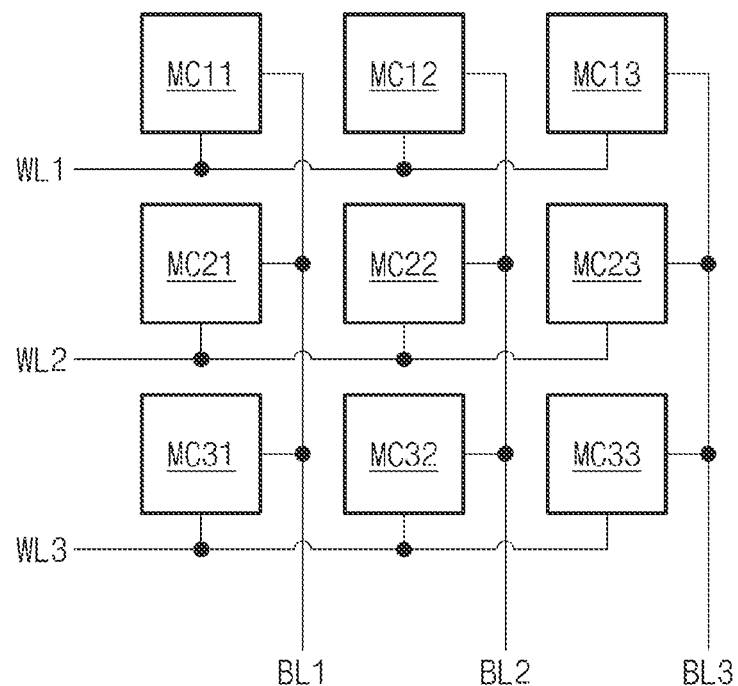
FIG. 2 is a diagram illustrating a memory cell array of FIG. 1.
Figure 3:
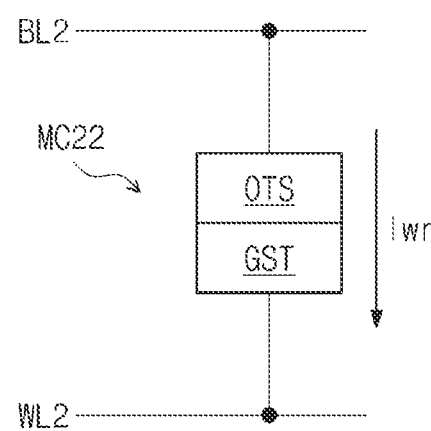
FIG. 3 is a diagram illustrating one of memory cells of FIG. 2.

FIG. 2 is a diagram illustrating a memory cell array of FIG. 1. FIG. 3 is a diagram illustrating one of memory cells of FIG. 2. For brevity of drawing and convenience of description, it is assumed that the memory cell array 110 includes 9 memory cells MC11 to MC33 arranged in 3 rows and 3 columns (i.e., a 3×3 matrix). However, the present disclosure is not limited thereto. For example, the number of memory cells and the arrangement of memory cells may be variously changed or modified. Also, one memory cell (e.g., MC22) will be described with reference to FIG. 3, but the present disclosure is not limited thereto. For example, the remaining memory cells may also have a structure similar to that of the memory cell MC22 of FIG. 3.

Referring to FIGS. 1 and 3, the memory cell array 110 may include the plurality of memory cells MC11 to MC33. The plurality of memory cells MC11 to MC33 may be connected with a plurality of word lines WL1 to WL3 and a plurality of bit lines BL1 to BL3.

Each of the plurality of memory cells MC11 to MC33 may be a phase change memory cell. For example, one memory cell (e.g., MC22) of the plurality of memory cells MC11 to MC33 is illustrated in FIG. 3. As illustrated in FIG. 3, the memory cell MC22 may be connected between the second word line WL2 and the second bit line BL2. The memory cell MC22 may include an ovonic threshold switch OTS and a phase change material GST.

The ovonic threshold switch OTS may be a switching element having a bidirectional characteristic. In an embodiment, the ovonic threshold switch OTS may be a switching element having a non-linear current-voltage characteristic (or a snapback characteristic). In an embodiment, the ovonic threshold switch OTS may have a crystalline-amorphous phase transition temperature higher than a phase change material (e.g., GST). For example, a phase transition temperature of the ovonic threshold switch OTS may be about 350° C. to about 450° C.

In an embodiment, the ovonic threshold switch OTS may include at least one of GeSe, GeS, AsSe, AsTe, AsS SiTe, SiSe, SiS, GeAs, SiAs, SnSe, and SnTe. In an embodiment, the ovonic threshold switch OTS may include at least one of GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe. In an embodiment, the ovonic threshold switch OTS may include at least one of GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn. In an embodiment, the ovonic threshold switch OTS may include at least one of GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn. In an embodiment, the ovonic threshold switch OTS may include at least one of GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

The phase change material GST may have one of a crystalline state and an amorphous state. For example, a threshold voltage of the phase change material GST being in the crystalline state may be lower than a threshold voltage of the phase change material GST being in the amorphous state. In an embodiment, in the case where the phase change material GST is in the crystalline state, the memory cell MC22 may be in the set state; in the case where the phase change material GST is in the amorphous state, the memory cell MC22 may be in the reset state.

A state (i.e., the crystalline state or the amorphous state) of the phase change material GST may be determined depending on a temperature. In an embodiment, a crystalline-amorphous phase transition temperature of the phase change material GST may be about 250° C. to about 350° C. A temperature of the phase change material GST may be determined depending on a magnitude and a time (or duration) of a write current Iwr flowing through the memory cell MC22. For example, in the case where the write current Iwr is at a first level and is applied during a first time (or first duration or a first time period), the phase change material GST may have the crystalline state; in the case where the write current Iwr is at a second level higher than the first level and is applied during a second time (or second duration or a second time period), the phase change material GST may have the amorphous state. That is, a state of the memory cell MC22 may be changed depending on the magnitude and the time of the write current Iwr, and thus, data may be written in the memory cell MC22. In an embodiment, the magnitude and the time of the write current Iwr may be determined depending on a voltage difference of the second bit line BL2 and the second word line WL2 and a characteristic of the ovonic threshold switch OTS.

In an embodiment, the phase change material GST may be formed of a compound of at least one of Te, Se, and S being a chalcogen element and at least one selected from a group of Ge, Sb, Bi, Pb, Sn, Ag, As, S, Si, In, Ti, Ga, P, O, and C.

In an embodiment, the phase change material GST may include at least one of GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb. In an embodiment, the phase change material GST may include at least one of GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS. In an embodiment, the phase change material GST may include at least one of GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS. In an embodiment, the phase change material GST may include at least one of InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn.

An embodiment is illustrated in FIG. 3 in which the ovonic threshold switch OTS is connected with the second bit line BL2 and the phase change material GST is connected between the ovonic threshold switch OTS and the second word line WL2, but the present disclosure is not limited thereto. For example, because the ovonic threshold switch OTS is a bidirectional switching element, the ovonic threshold switch OTS may be connected with a word line and the phase change material GST may be connected between the ovonic threshold switch OTS and a bit line.

An embodiment is illustrated in FIG. 3 in which the write current Iwr flows from a bit line to a word line, but the present disclosure is not limited thereto. For example, a direction of the write current Iwr or a read current (not illustrated) may be variously changed or modified depending on a way to implement a memory device (i.e., a WL to BL direction or a BL to WL direction). Below, for convenience of description, it is assumed that a write current (in particular, a current for the reset write operation) flows toward a word line from a bit line.

Figure 4A:
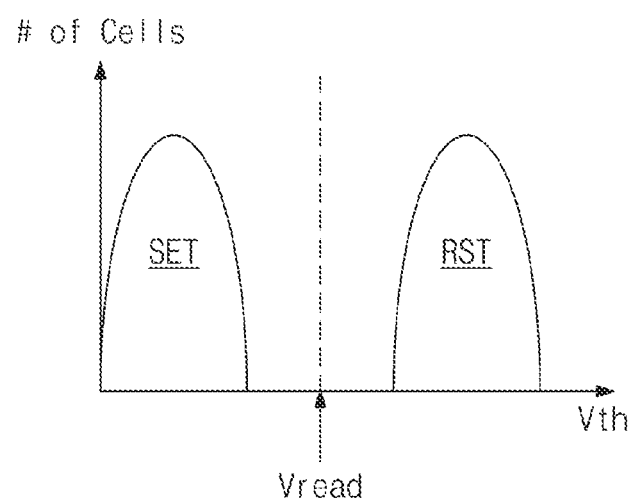
FIGS. 4A and 4B are diagrams for describing a characteristic according to a state of a memory cell.
Figure 4B:
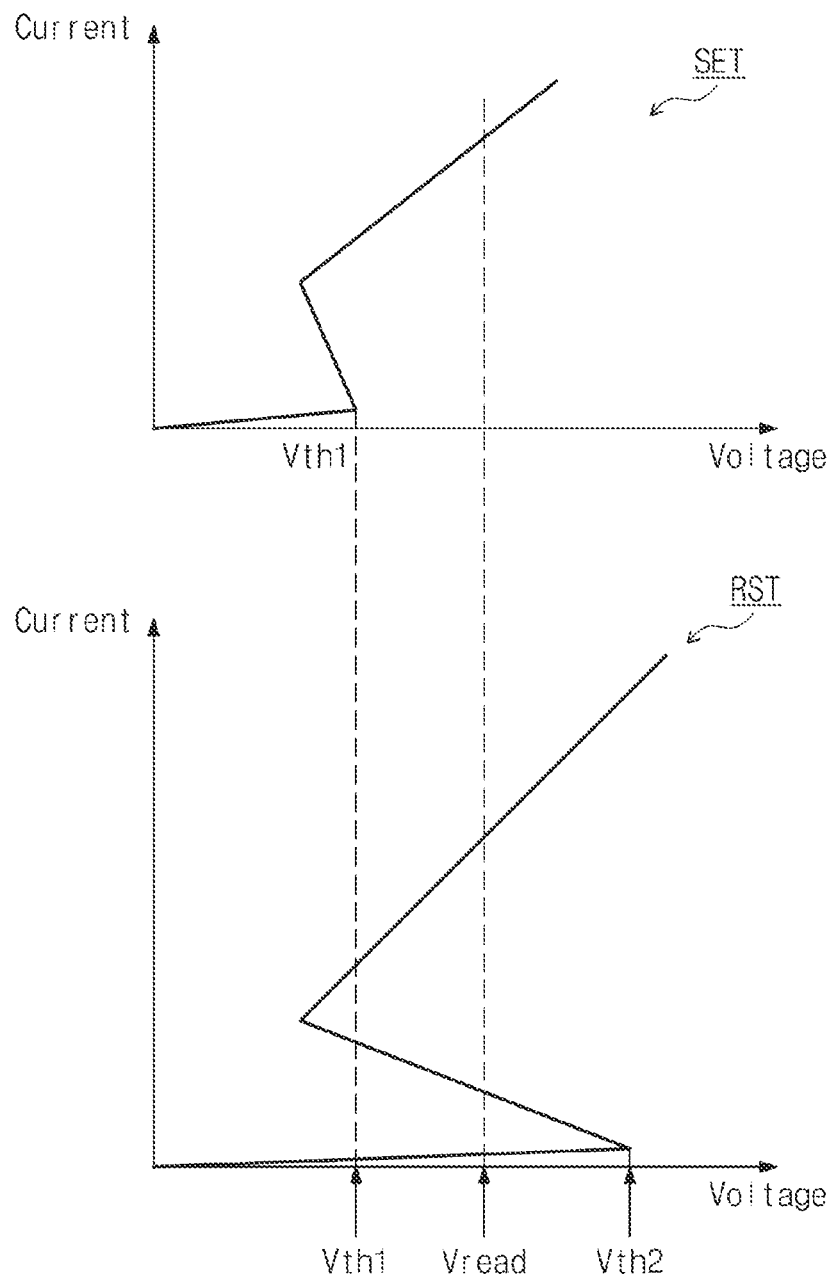

FIGS. 4A and 4B are diagrams for describing a characteristic according to a state of a memory cell. FIG. 4A shows threshold voltage distributions of memory cells, and FIG. 4B shows voltage-current curves according to states of memory cells. In the distributions of FIG. 4A, a horizontal axis represents a threshold voltage of a memory cell and a vertical axis represents the number of memory cells. In the graphs of FIG. 4B, a horizontal axis represents a voltage applied to a memory cell (i.e., a voltage difference between a bit line and a word line) and a vertical axis represents a current flowing through a memory cell.

Referring to FIGS. 4A and 4B, as described above, a memory cell may have one of a set state SET and a reset state RST. A threshold voltage Vth of a memory cell of the set state SET may be smaller than a threshold voltage Vth of a memory cell of the reset state RST. For example, an upper limit value of the threshold voltage distribution of the set state SET may be smaller than a lower limit value of the threshold voltage distribution of the reset state RST. For example, as illustrated in FIG. 4B, a threshold voltage of a memory cell of the set state SET may be a first threshold voltage Vth1 and a threshold voltage of a memory cell of the reset state RST may be a second threshold voltage Vth2 greater than the first threshold voltage Vth1.

To read data stored in a specific memory cell, a read voltage Vread may be applied between a bit line and a word line connected with the specific memory cell. In this case, as illustrated in FIG. 4B, when the specific memory cell is in the set state SET, the specific memory cell may be turned on; when the specific memory cell is in the reset state RST, the specific memory cell may be turned off. That is, data stored in the specific memory cell may be read by determining whether the specific memory cell is turned on or turned off, with the read voltage Vread applied between the bit line and the word line connected with the specific memory cell.

Figure 5:
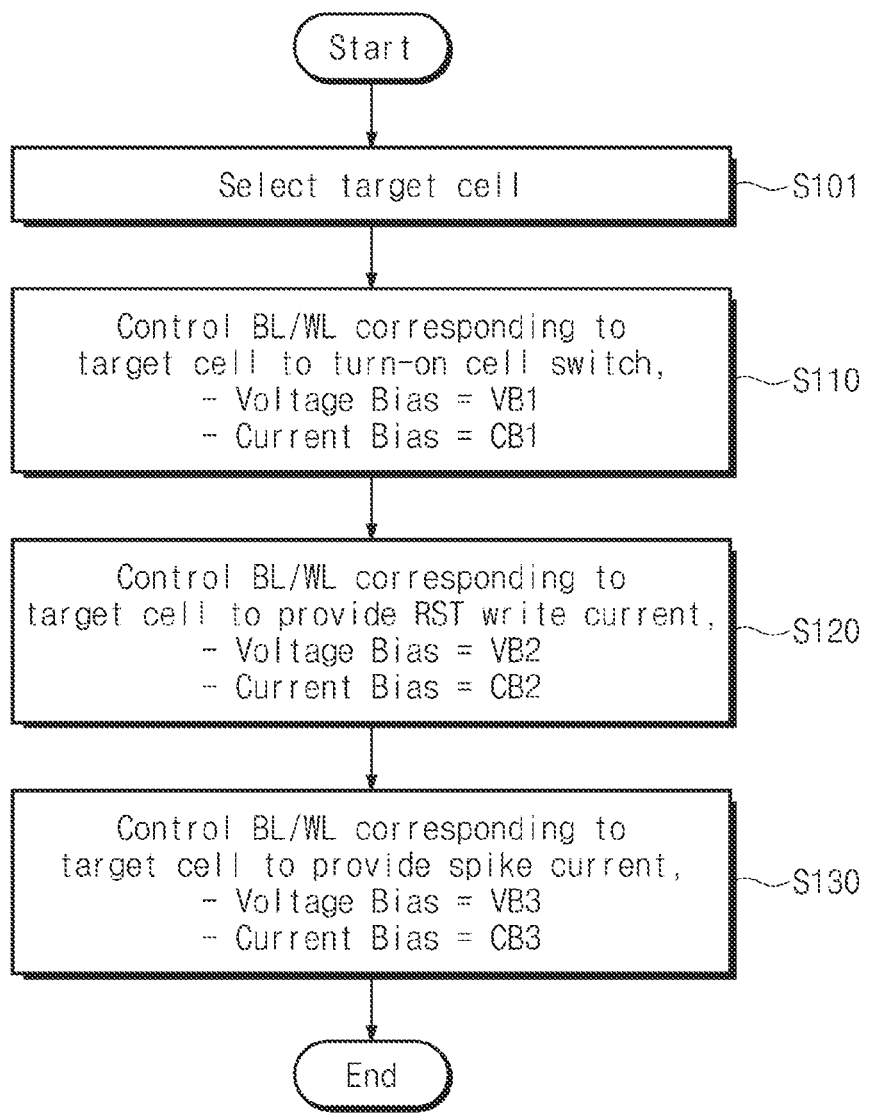
FIG. 5 is a flowchart illustrating a write operation of a memory device of FIG. 1.
Figure 6:
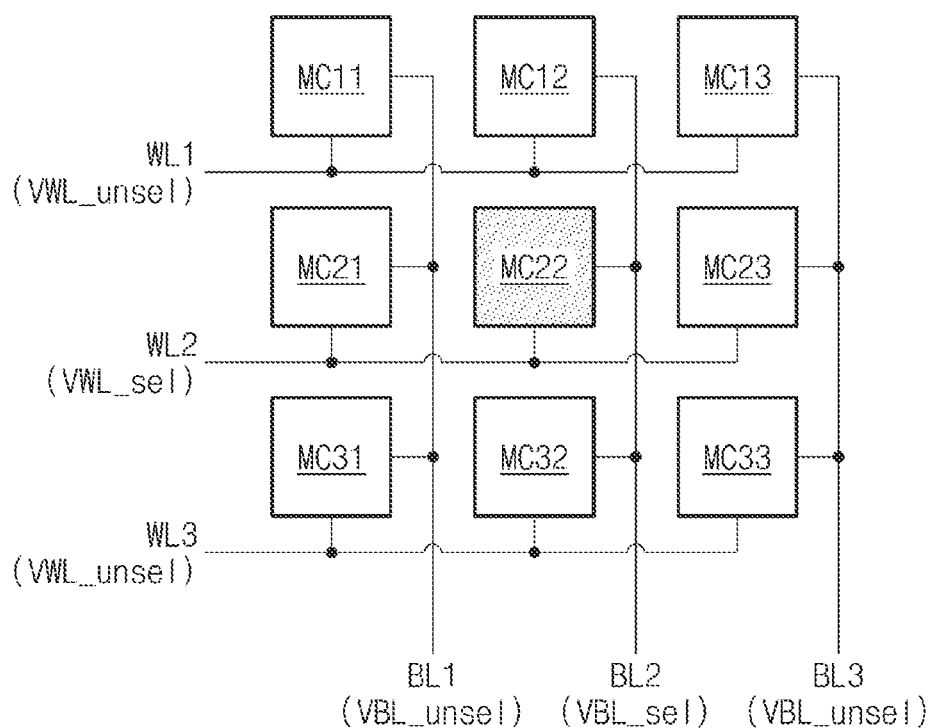
FIG. 6 is a diagram for describing an operation according to a flowchart of FIG. 5.

FIG. 5 is a flowchart illustrating a write operation of a memory device of FIG. 1. FIG. 6 is a diagram for describing an operation according to the flowchart of FIG. 5. Below, for convenience of description, it is assumed that the memory device 100 performs the reset write operation on the memory cell MC22. That is, the memory device 100 may change a state of the memory cell MC22 from the set state SET to the reset state RST through a write method to be described below. Below, the memory cell MC22 is referred to as a "target memory cell", and the second bit line BL2 and the second word line WL2 are respectively referred to as a "target bit line" and a "target word line".

Below, the terms "voltage bias" and "current bias" are used. The voltage bias may indicate a voltage difference of a relevant bit line and a relevant word line. The current bias may indicate a restriction current flowing to the relevant bit line. In this case, the restriction current by the current bias may not be absolute; even though a current is restricted by the current bias, it may be understood that a current larger than the current bias flows in a moment depending on any other voltage bias or a physical state of a target memory cell.

Referring to FIGS. 1, 5, and 6, in operation S101, the memory device 100 may select a target memory cell. For example, the memory device 100 may receive an address and data from an external device (e.g., a memory controller) and may select a target memory cell based on the received address and data. In this case, the target memory cell may indicate a memory cell to be changed from the set state SET to the reset state RST.

In detail, as illustrated in FIG. 6, the memory cell MC22 (hereinafter, MC22 being referred to as a "target memory cell") may be selected as a target memory cell. The target memory cell MC22 may indicate a memory cell to be changed from the set state SET to the reset state RST.

In operation S110, the memory device 100 may control a target bit line BL and a target word line WL corresponding to the target memory cell MC22 such that the target memory cell MC22 is turned on. For example, the memory device 100 may apply a first voltage bias VB1 between a target bit line BL2 and a target word line WL2 connected with the target memory cell MC22. In detail, as illustrated in FIG. 6, the selection bit line voltage VBL_sel may be applied to the target bit line BL2 connected with the target memory cell MC22 and the selection word line voltage VWL_sel may be applied to the target word line WL2 connected with the target memory cell MC22. In this case, a difference between the selection word line voltage VWL_sel and the selection bit line voltage VBL_sel may be the first voltage bias VB1.

The memory device 100 may apply a first current bias CB1 to the target bit line BL2 connected with the target memory cell MC22. A current flowing through the target bit line BL2 may be restricted by the first current bias CB1.

In an embodiment, the first voltage bias VB1 may be a voltage level higher than a threshold voltage of a memory cell of the reset state RST. That is, in the case where the first voltage bias VB1 is applied to the target bit line BL2 and the target word line WL2 of the target memory cell MC22, the target memory cell MC22 may be turned on. The first current bias CB1 may be a set write current (to be described with reference to FIG. 7).

In an embodiment, the non-selection word line voltage VWL_unsel may be applied to unselected word lines (e.g., WL1 and WL3), and the non-selection bit line voltage VBL_unsel may be applied to unselected bit lines BL1 and BL3. The non-selection word line voltage VWL_unsel and the non-selection bit line voltage VBL_unsel may be set such that the remaining memory cells MC11 to MC13, MC21, MC23, and MC31 to MC33 other than the target memory cell MC22 are not turned on.

For example, the memory cell MC11 may not be turned on by the non-selection word line voltage VWL_unsel of the first word line WL1 and the non-selection bit line voltage VBL_unsel of the first bit line BL1. The memory cell MC12 may not be turned on by the non-selection word line voltage VWL_unsel of the first word line WL1 and the selection bit line voltage VBL_sel of the second bit line BL2. The memory cell MC21 may not be turned on by the non-selection word line voltage VWL_unsel of the second word line WL2 and the non-selection bit line voltage VBL_unsel of the first bit line BL1.

In operation S120, the memory device 100 may control the target bit line BL2 and the target word line WL2 corresponding to the target memory cell MC22 such that a reset write current is provided to the target memory cell MC22. For example, the memory device 100 may control the selection bit line voltage VBL_sel and the selection word line voltage VWL_sel such that a second voltage bias VB2 is applied to the target bit line BL2 and the target word line WL2 of the target memory cell MC22. The memory device 100 may apply a second current bias CB2 to the target bit line BL2 connected with the target memory cell MC22.

Operation S120 is similar to operation S110 except that a voltage bias and a current bias between a target bit line and a target word line connected with a target memory cell in operation S120 are different from those in operation S110, and thus, additional description will be omitted to avoid redundancy. In an embodiment, the second voltage bias VB2 may be greater than the first voltage bias VB1 and the second current bias CB2 may be greater than the first current bias CB1. In an embodiment, the second current bias CB2 may correspond to a magnitude of the reset write current.

In operation S130, the memory device 100 may control the second bit line BL2 and the second word line WL2 corresponding to the target memory cell MC22 such that spike currents (or current pulses) are provided to the target memory cell MC22. For example, the memory device 100 may control the selection bit line voltage VBL_sel and the selection word line voltage VWL_sel such that a third voltage bias VB3 is applied to the second bit line BL2 and the second word line WL2 of the target memory cell MC22. The memory device 100 may apply a third current bias CB3 to the target bit line BL2 connected with the target memory cell MC22.

Operation S130 is similar to operation S110 except that a voltage bias and a current bias between a target bit line and a target word line connected with a target memory cell in operation S130 are different from those in operation S110, and thus, additional description will be omitted to avoid redundancy. In an embodiment, the third current bias CB3 may be smaller than each of the first and second current biases CB1 and CB2. In an embodiment, the third current bias CB3 may be smaller than or equal to a hold current Ihold according to a current-voltage characteristic of the target memory cell MC22. In an embodiment, the hold current Ihold may indicate a minimum current magnitude necessary for the target memory cell MC2 to maintain a turn-on state.

In an embodiment, in the case where the third voltage bias VB3 and the third current bias CB3 are applied to the target memory cell MC22 in operation S130, at least one spike current (or at least one current pulse) may be generated by a physical characteristic of the target memory cell MC22. In an embodiment, at least one spike current may be generated by an iterative switching operation of a target memory cell.

A threshold voltage of a target memory cell may be finely adjusted (or increased) by the at least one spike current (or the at least one current pulse). That is, as the threshold voltage of the target memory cell is increased by the at least one spike current (or the at least one current pulse), a read margin may be secured. A write operation using at least one spike current (or at least one current pulse) will be described with reference to the following drawings.

As described above, according to an embodiment of the present disclosure, the memory device 100 may turn on a target memory cell based on the first voltage bias VB1. Afterwards, the memory device 100 may apply the reset write current to the target memory cell based on the second voltage bias VB2 such that the threshold voltage of the target memory cell increases. Afterwards, the memory device 100 may apply at least one spike current or at least one current pulse to the target memory cell based on the third voltage bias VB3 such that the threshold voltage of the target memory cell slowly increases.

In an embodiment, the memory device 100 according to an embodiment of the present disclosure may generate at least one current pulse in a state where a voltage bias between a target bit line and a target word line connected with the target memory cell is uniformly maintained.

In an embodiment, a time during which a reset write current is applied in the memory device 100 according to an embodiment of the present disclosure may be shorter than a time during which a reset write current is applied in a conventional phase change memory. However, in the present disclosure, as a threshold voltage of a target memory cell is stepwise or gradually increased through at least one spike current or at least one current pulse, data may be normally written in the target memory cell. Accordingly, the reliability and lifetime of the memory device 100 may be provided.

Figure 7:
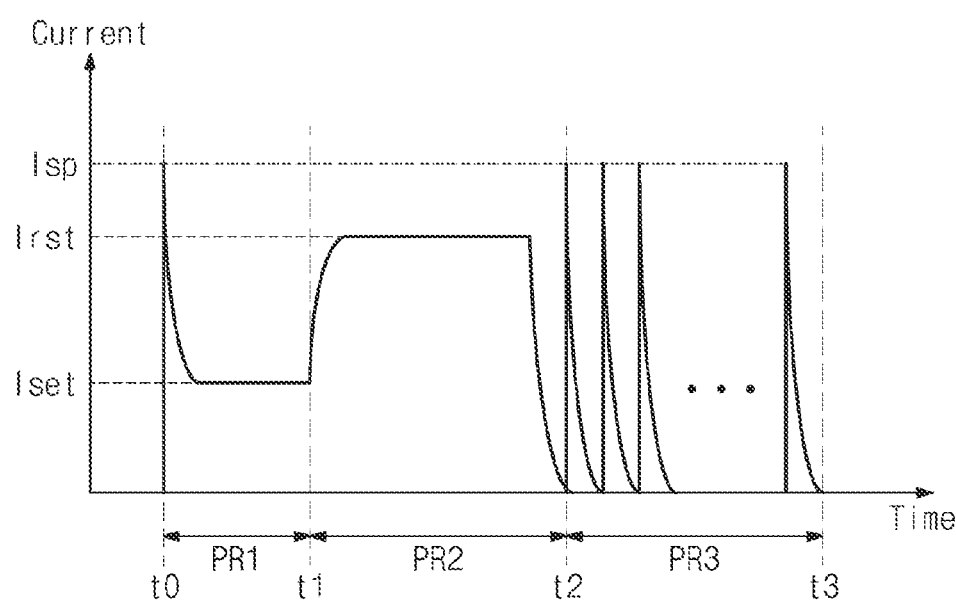
FIG. 7 is a timing diagram illustrating a current flowing through a target memory cell depending on an operation of a flowchart of FIG. 6.

FIG. 7 is a timing diagram illustrating a current flowing through a target memory cell depending on an operation of the flowchart of FIG. 6. In the timing diagram of FIG. 7, a horizontal axis represents time and a vertical axis represents a current flowing through the target memory cell MC22.

Referring to FIGS. 6 and 7, the memory device 100 may change a state of the target memory cell MC22 from the set state SET to the reset state RST through first to third periods PR1 to PR3. The first period PR1 may correspond to operation S110 of FIG. 5, the second period PR2 may correspond to operation S120 of FIG. 5, and the third period PR3 may correspond to operation S130 of FIG. 5.

First, in the first period PR1 from a 0-th time t0 to a first time t1, the first voltage bias VB1 may be applied to the second bit line BL2 and the second word line WL2 of the target memory cell MC22. In this case, such a current as illustrated in the first period PR1 of FIG. 7 may flow through the target memory cell MC22. In detail, at the 0-th time t0, the target memory cell MC22 may have the set state SET. The first voltage bias VB1 may be higher than an upper limit value of a threshold voltage distribution of the set state SET. Accordingly, at the 0-th time t0, when the first voltage bias VB1 is applied, the target memory cell MC22 may be turned on, and thus, a peak current Isp may flow in a moment. Afterwards, as the current decreases depending on a current-voltage characteristic (i.e., a snapback characteristic) of the target memory cell MC22, a current magnitude may be maintained at a set write current Iset.

In an embodiment, the first current bias CB1 applied in the first period PR1 may be correspond to the set write current Iset. In an embodiment, in the case where the set write current Iset is consistently maintained, the target memory cell MC22 may have the set state SET. That is, in the case where there is a need to switch a state of the target memory cell MC22 from the reset state RST to the set state SET, a current flowing through the target memory cell MC22 may be maintained at the set write current Iset.

During the second period PR2 from the first time t1 to a second time t2, the second voltage bias VB2 may be applied to the second bit line BL2 and the second word line WL2 of the target memory cell MC22. In this case, such a reset write current Irst as illustrated in the second period PR2 of FIG. 7 may flow through the target memory cell MC22. The reset write current Irst may be greater than the set write current Iset. The reset write current Irst may be a current for setting the phase change material GST of the target memory cell MC22 to the amorphous state. In an embodiment, the second current bias CB2 applied in the second period PR2 may be correspond to the reset write current Irst.

During the third period PR3 from the second time t2 to a third time t3, the third voltage bias VB3 may be applied to the second bit line BL2 and the second word line WL2 of the target memory cell MC22. In this case, the third voltage bias VB3 may be lower than the second voltage bias VB2 or may be equal to or lower than the first voltage bias VB1.

During the third period PR3, as the third voltage bias VB3 is applied to the second bit line BL2 and the second word line WL2 of the target memory cell MC22, as illustrated in FIG. 7, a plurality of spike currents (or a plurality of current pulses) may flow through the target memory cell MC22. In an embodiment, a peak value of the plurality of spike currents may correspond to a value of Isp or may be changed depending on the number of current pulses to be generated. Alternatively, the peak value of the plurality of spike currents may be determined depending on a current state or a physical characteristic of the target memory cell MC22.

In an embodiment, the number of spike currents may be changed depending on the current state or the physical characteristic of the target memory cell MC22.

In an embodiment, each of a time (i.e., t0 to t1) of the first period PR1, a time (i.e., t1 to t2) of the second period PR2, and a time (i.e., t2 to t3) of the third period PR3 may be a given time. In an embodiment, the times of the first to third periods PR1 to PR3 may have a relationship of PR2>PR3≥PR1.

FIGS. 8A to 8D are timing diagrams illustrating voltage biases according to an operation of the flowchart of FIG. 6. In the timing diagrams of FIGS. 8A to 8D, a horizontal axis represents time and a vertical axis represents voltage. For brevity of drawing, in each timing diagram, a dash-single dotted line indicates the selection word line voltage VWL_sel and a solid line indicates the selection bit line voltage VBL_sel. The selection bit line voltage VBL_sel and the selection word line voltage VWL_sel to be described with reference to FIGS. 8A to 8D may be generated or adjusted by the voltage bias circuit 140 described with reference to FIG. 1.

Figure 8A:
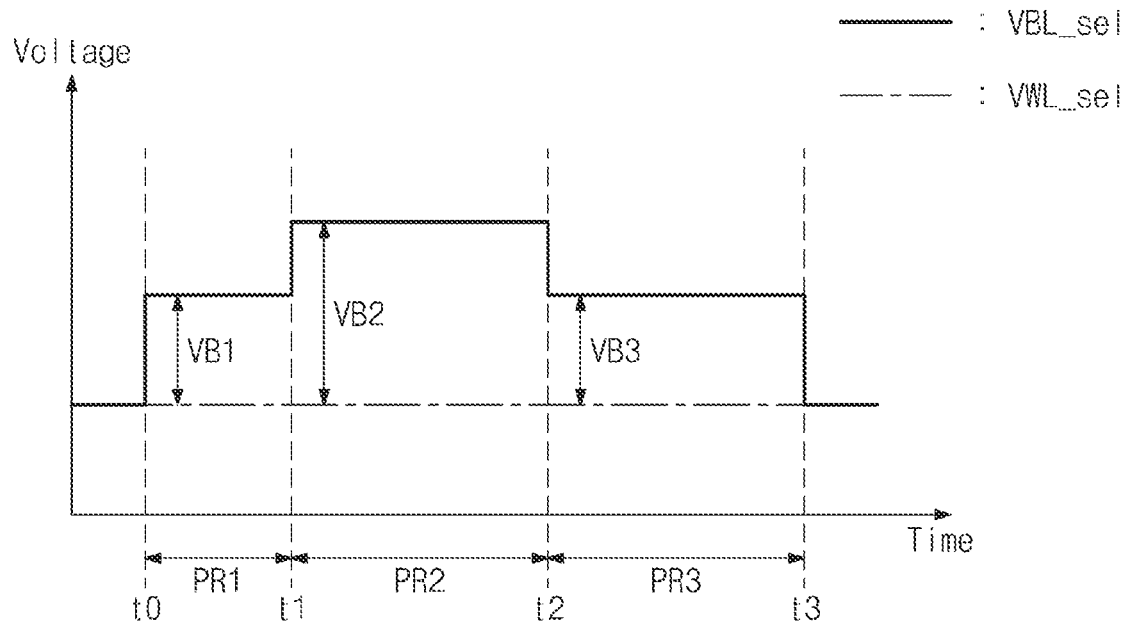
FIGS. 8A to 8D are timing diagrams illustrating voltage biases according to an operation of a flowchart of FIG. 6.

First, as illustrated in FIG. 8A, during the reset write operation, the selection word line voltage VWL_sel may maintain a uniform level and the selection bit line voltage VBL_sel may change in the first to third periods PR1 to PR3. For example, in the first period PR1, the selection bit line voltage VBL_sel may increase such that a voltage difference of the selection bit line voltage VBL_sel and the selection word line voltage VWL_sel is the first voltage bias VB1. Next, in the second period PR2, the selection bit line voltage VBL_sel may increase such that a voltage difference of the selection bit line voltage VBL_sel and the selection word line voltage VWL_sel is the second voltage bias VB2. Then, in the third period PR3, the selection bit line voltage VBL_sel may decrease such that a voltage difference of the selection bit line voltage VBL_sel and the selection word line voltage VWL_sel is the third voltage bias VB3. In an embodiment, the selection word line voltage VWL_sel may be a ground voltage or may be a given voltage.

Figure 8B:
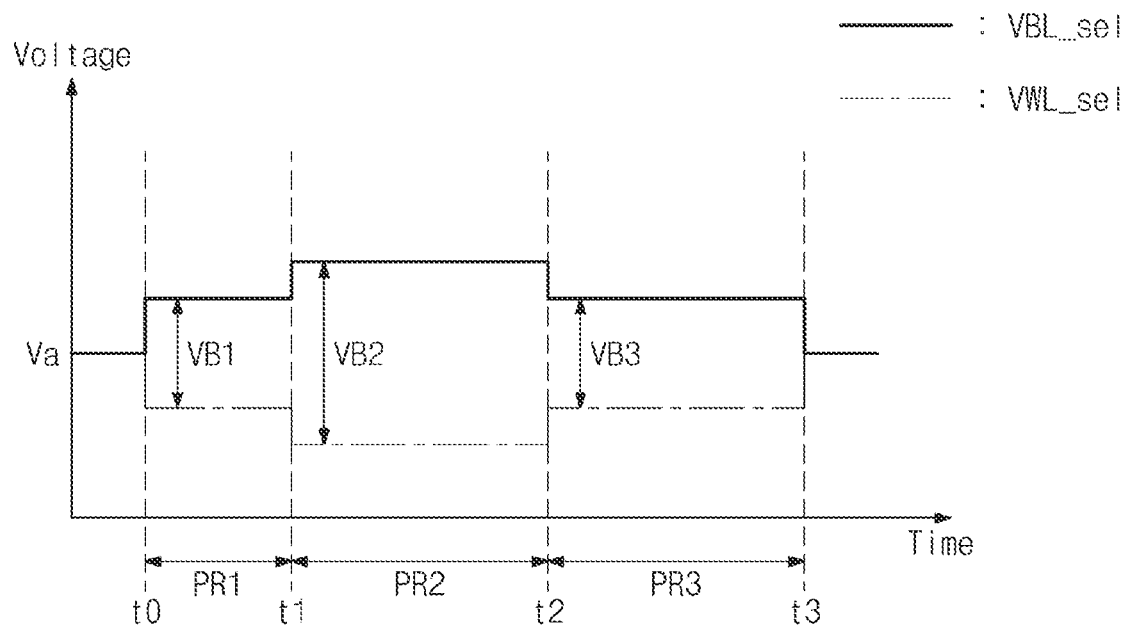

First, as illustrated in FIG. 8B, during the reset write operation, the selection word line voltage VWL_sel and the selection bit line voltage VBL_sel may change in the first to third periods PR1 to PR3. For example, in the first period PR1, the selection bit line voltage VBL_sel may increase from a voltage Va, and the selection word line voltage VWL_sel may decrease from the voltage Va; thus, in the first period PR1, a voltage difference of the selection bit line voltage VBL_sel and the selection word line voltage VWL_sel may be the first voltage bias VB1. Next, in the second period PR2, the selection bit line voltage VBL_sel may increase, and the selection word line voltage VWL_sel may decrease; thus, in the second period PR2, a voltage difference of the selection bit line voltage VBL_sel and the selection word line voltage VWL_sel may be the second voltage bias VB2. Then, in the third period PR3, the selection bit line voltage VBL_sel may decrease, and the selection word line voltage VWL_sel may increase; thus, in the third period PR3, a voltage difference of the selection bit line voltage VBL_sel and the selection word line voltage VWL_sel may be the third voltage bias VB3. In an embodiment, the voltage Va may be the ground voltage or may be a given voltage.

Figure 8C:
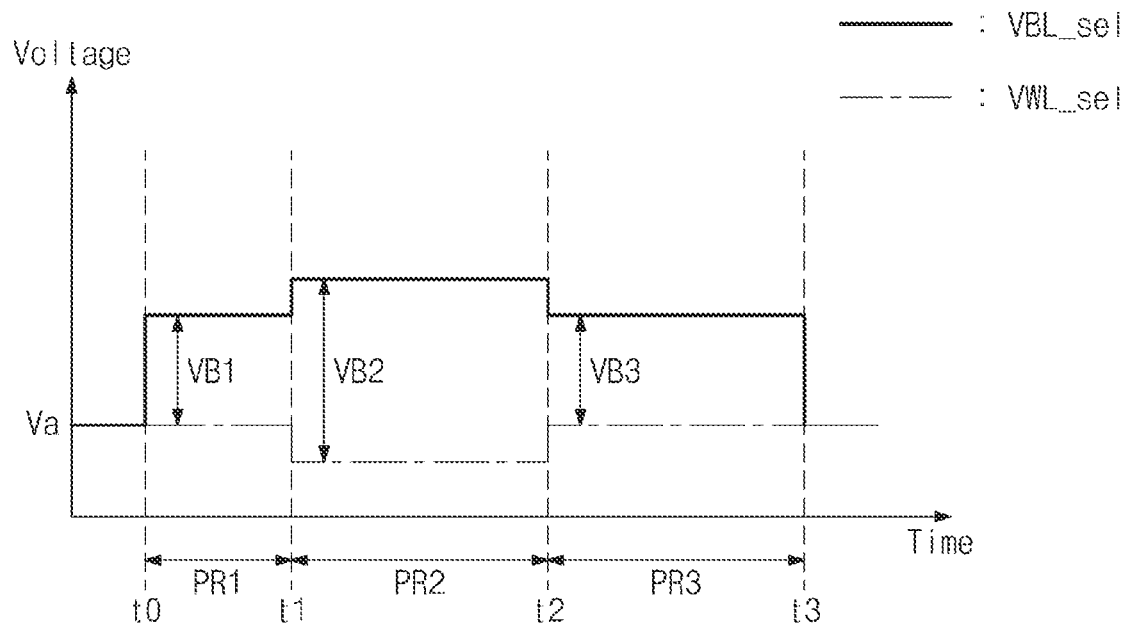

Then, as illustrated in FIG. 8C, during the reset write operation, the selection word line voltage VWL_sel and the selection bit line voltage VBL_sel may change in the first to third periods PR1 to PR3. For example, in the first period PR1, the selection word line voltage VWL_sel may maintain the voltage Va and the selection bit line voltage VBL_sel may increase such that a voltage difference of the selection bit line voltage VBL_sel and the selection word line voltage VWL_sel is the first voltage bias VB1. Next, in the second period PR2, the selection bit line voltage VBL_sel may increase and the selection word line voltage VWL_sel may decrease; thus, in the second period PR2, a voltage difference of the selection bit line voltage VBL_sel and the selection word line voltage VWL_sel may be the second voltage bias VB2. Then, in the third period PR3, the selection bit line voltage VBL_sel may decrease and the selection word line voltage VWL_sel may increase; thus, in the third period PR3, a voltage difference of the selection bit line voltage VBL_sel and the selection word line voltage VWL_sel may be the third voltage bias VB3. In an embodiment, the selection word line voltage VWL_sel in the first and third periods PR1 and PR3 may be the same as the voltage Va. The voltage Va may be the ground voltage or may be a given voltage.

Figure 8D:
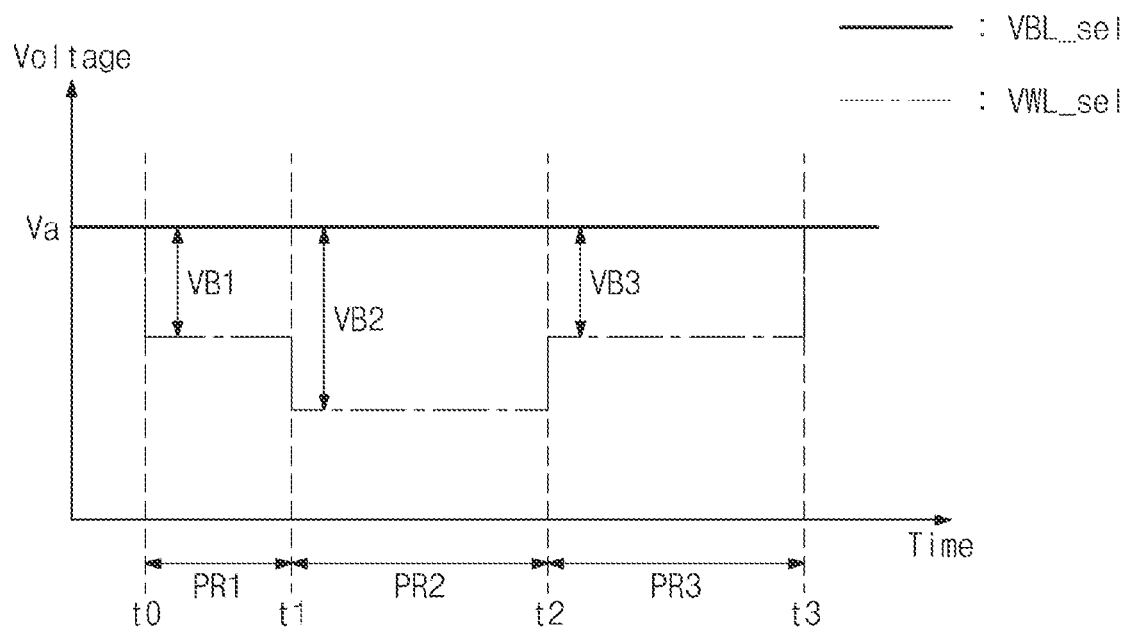

Then, as illustrated in FIG. 8D, during the reset write operation, the selection bit line voltage VBL_sel may maintain a uniform level and the selection word line voltage VWL_sel may change in the first to third periods PR1 to PR3. For example, in the first period PR1, the selection word line voltage VWL_sel may decrease such that a voltage difference of the selection bit line voltage VBL_sel and the selection word line voltage VWL_sel is the first voltage bias VB1. Next, in the second period PR2, the selection word line voltage VWL_sel may decrease such that a voltage difference of the selection bit line voltage VBL_sel and the selection word line voltage VWL_sel is the second voltage bias VB2. Then, in the third period PR3, the selection word line voltage VWL_sel may increase such that a voltage difference of the selection bit line voltage VBL_sel and the selection word line voltage VWL_sel is the third voltage bias VB3. In an embodiment, the selection bit line voltage VBL_sel may be the ground voltage or may be a given voltage.

The above way to control a bit line and a word line is provided as an example, and the present disclosure is not limited thereto. For example, the memory device 100 according to an embodiment of the present disclosure may control a bit line and a word line of a target memory cell in various manners, during the reset write operation. In this case, the memory device 100 may control the bit line and the word line of the target memory cell such that voltage differences of the bit line and the word line of the target memory cell are the first to third voltage biases VB1 to VB3 in the first to third periods PR1 to PR3, respectively.

In an embodiment, the non-selection bit line voltage VBL_unsel and the non-selection word line voltage VWL_unsel may be variously controlled depending on a way to drive the selection word line voltage VWL_sel and the selection bit line voltage VBL_sel. In an embodiment, in each of the first to third periods PR1 to PR3, the non-selection bit line voltage VBL_unsel and the non-selection word line voltage VWL_unsel may have an intermediate value of the selection word line voltage VWL_sel and the selection bit line voltage VBL_sel. For example, referring to the timing diagram of FIG. 8A, in the first period PR1, the non-selection bit line voltage VBL_unsel and the non-selection word line voltage VWL_unsel may be greater than the selection word line voltage VWL_sel by as much as half the first voltage bias VB1 (i.e., VB1/2); in the second period PR2, the non-selection bit line voltage VBL_unsel and the non-selection word line voltage VWL_unsel may be greater than the selection word line voltage VWL_sel by as much as half the second voltage bias VB2 (i.e., VB2/2); in the third period PR3, the non-selection bit line voltage VBL_unsel and the non-selection word line voltage VWL_unsel may be greater than the selection word line voltage VWL_sel by as much as half the third voltage bias VB3 (i.e., VB3/2). Alternatively, in the case where the selection bit line voltage VBL_sel and the selection word line voltage VWL_sel are driven as illustrated in FIG. 8B, the non-selection bit line voltage VBL_unsel and the non-selection word line voltage VWL_unsel may be the specific voltage Va.

In this case, because a voltage difference of an unselected word line and an unselected bit line is 0 V and a voltage difference of a selected bit line and the unselected word line and a voltage difference of the unselected bit line and the unselected word line are a maximum of VB2/2, memory cells (e.g., MC11, MC12, MC13, MC21, MC23, MC31, MC32, and MC33 of FIG. 6) connected with the unselected word line and the unselected bit line may not be turned on.

The above ways to control the non-selection bit line voltage VBL_unsel and the non-selection word line voltage VWL_unsel are provided as an example, and the present disclosure is not limited thereto. For example, the non-selection bit line voltage VBL_unsel and the non-selection word line voltage VWL_unsel may be controlled in various manners.

Figure 9A:
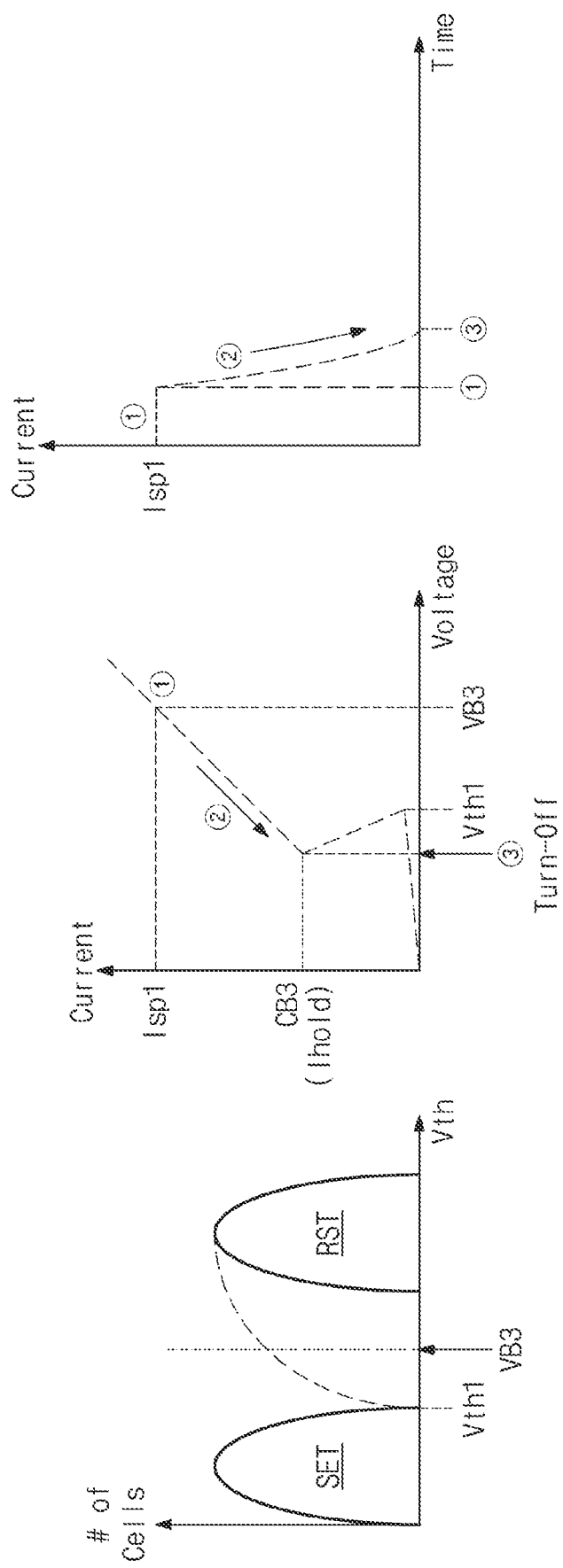
Figure 9C:
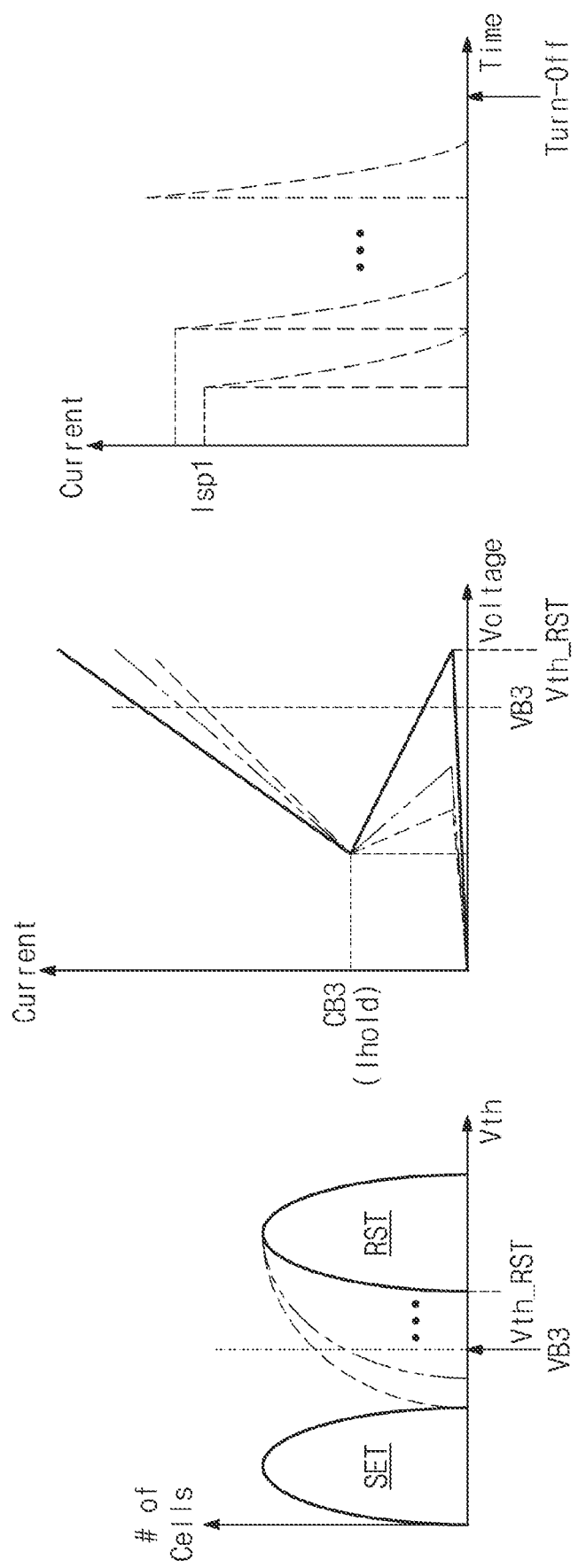

FIGS. 9A to 9C are distribution diagrams, current-voltage graphs, and timing diagrams for describing operation S130 of FIG. 5. In the distribution diagrams of FIGS. 9A and 9B, a horizontal axis represents a threshold voltage of memory cells and a vertical axis represents the number of memory cells. In the current-voltage graphs of FIGS. 9A to 9C, a horizontal axis represents a voltage applied to a memory cell (i.e., a voltage between a bit line and a word line) and a vertical axis represents a current flowing through a memory cell. In the timing diagrams of FIGS. 9A to 9C, a horizontal axis represents time and a vertical axis represents a current flowing through a memory cell.

For brevity of drawing and convenience of description, the distribution diagrams, current-voltage graphs, and timing diagrams illustrated in FIGS. 9A to 9C are associated with a memory cell at a specific time, but the present disclosure is not limited thereto.

First, referring to FIGS. 5 and 9A, after operation S120 is completed, a target memory cell may have a first threshold voltage Vth1 as illustrated in the distribution diagram of FIG. 9A. That is, even though a threshold voltage of the target memory cell increases compared to the set state SET, the threshold voltage of the target memory cell may fail to reach the reset state RST, which is an intended state of the target memory cell.

In this case, the third voltage bias VB3 may be applied to a bit line and a word line of the target memory cell. The third voltage bias VB3 may be higher than an upper limit value of the threshold voltage distribution of the set state SET and may be lower than a lower limit value of the threshold voltage distribution of the reset state RST. In an embodiment, the third voltage bias VB3 may correspond to the read voltage Vread described with reference to FIGS. 4A and 4B. Alternatively, the third voltage bias VB3 may correspond to the lower limit value of the threshold voltage distribution of memory cells belonging to the reset state RST.

In the case where the third voltage bias VB3 is applied to the bit line and the word line of the target memory cell, as illustrated in the current-voltage graph of FIG. 9A, because the third voltage bias VB3 is higher than the first threshold voltage Vth1 of the target memory cell, a first peak current Isp1 may flow through the target memory cell (operation ①).

Because the third current bias CB3 is applied through the bit line of the target memory cell, after operation ①, a current flowing through the target memory cell may slowly decrease to the third current bias CB3 (operation ②). In an embodiment, the third current bias CB3 may be smaller than or equal to the hold current Ihold of the target memory cell. The hold current Ihold may indicate a minimum current necessary for the target memory cell to maintain a turn-on state. In this case, when a current flowing through the target memory cell decreases to the hold current Ihold or lower, the target memory cell may be turned off (operation ③).

Through operation ①, operation ②, and operation ③ described above, a current flowing through the target memory cell may be the same as a current illustrated in the timing diagram of FIG. 9A. That is, in the case where the third voltage bias VB3 is applied to the bit line and the word line of the target memory cell and the third current bias CB3 is applied to the target memory cell, a spike current (or a current pulse) having the first peak current Isp1 may be generated by a turn-on and a turn-off of the target memory cell (i.e., the ovonic threshold switch OTS).

In an embodiment, a threshold voltage of the target memory cell may be increased by the spike current (or the current pulse) by as much as a given level as illustrated in FIG. 9B. For example, the threshold voltage of the target memory cell may increase from the first threshold voltage Vth1 to a second threshold voltage Vth2 by the spike current (or the current pulse) described with reference to FIG. 9A. In this case, a current-voltage characteristic of the target memory cell is illustrated by a dash-single dotted line of the current-voltage graph of FIG. 9B.

In this case, the memory device 100 may be in a state where a voltage difference of the bit line and the word line of the target memory cell is maintained at the third voltage bias VB3. As in the above description, because the third voltage bias VB3 is higher than the second threshold voltage Vth2, the target memory cell may be turned on, and thus, a second peak current Isp2 may flow through the target memory cell (④). In an embodiment, the second peak current Isp2 may be greater than the first peak current Isp2 described with reference to FIG. 9A. However, the present disclosure is not limited thereto. For example, peak values of a plurality of spike currents may be the same or different depending on a physical characteristic of a memory cell.

Afterwards, as in the above description, a current flowing through the target memory cell may slowly decrease to the third current bias CB3 (operation ⑤); when the current flowing through the target memory cell is lower than the hold current Ihold, the target memory cell may be turned off (operation ⑥).

As in the above description, in the case where the third voltage bias VB3 is applied to the bit line and the word line of the target memory cell and the third current bias CB3 is applied to the target memory cell, the target memory cell (in particular, the ovonic threshold switch OTS) may be repeatedly turned on and turned off by a physical characteristic (e.g., a snapback characteristic of a current-voltage) of the target memory cell. A spike current or a current pulse may be generated by the turn-on and turn-off operation of the target memory cell (in particular, the ovonic threshold switch OTS) and a threshold voltage of the target memory cell may slowly increase by the generated spike current or current pulse.

In an embodiment, the iteration of the turn-on and turn-off operation of the target memory cell (in particular, the ovonic threshold switch OTS) may be made until the threshold voltage of the target memory cell increases to a specific value (e.g., the third voltage bias VB3 or a reset threshold voltage Vth_RST).

For example, as illustrated in FIG. 9C, in the case where the third voltage bias VB3 is applied to the bit line and the word line of the target memory cell and the third current bias CB3 is applied to the target memory cell, spike currents or current pulses may be generated by iterative turn-on and turn-off operations of the target memory cell. The generated spike currents or current pulses may allow the threshold voltage of the target memory cell to slowly increase and then reach the reset threshold voltage Vth_RST.

In this case, a current-voltage characteristic of the target memory cell is illustrated by a solid line in the current-voltage graph of FIG. 9C. As illustrated in the current-voltage graph of FIG. 9C, because the threshold voltage (i.e., Vth_RST) of the target memory cell is higher than the third voltage bias VB3, the target memory cell may maintain a turn-off state. Accordingly, a spike current or a current pulse described above may not be generated.

As described above, during the reset write operation, the memory device 100 according to an embodiment of the present disclosure may apply the reset write current Irst to the target memory cell such that a threshold voltage of the target memory cell increases. Afterwards, the memory device 100 may apply the third voltage bias VB3 between the bit line and the word line of the target memory cell and may apply the third current bias CB3 to the target memory cell. In this case, as the target memory cell is repeatedly turned on and turned off, a plurality of spike currents or a plurality of current pulses may flow through the target memory cell. The threshold voltage of the target memory cell may slowly increase to an intended threshold voltage (e.g., Vth_RST) through the plurality of spike currents or the plurality of current pulses. In an embodiment, the target memory cell may be repeatedly turned on and turned off until the threshold voltage of the target memory cell is the intended threshold voltage or higher. The number of times of a turn-on and turn-off operation of the target memory cell or the number of spike currents may be variable depending on a physical characteristic, a current state, or a current threshold voltage of the target memory cell.

Figure 10:
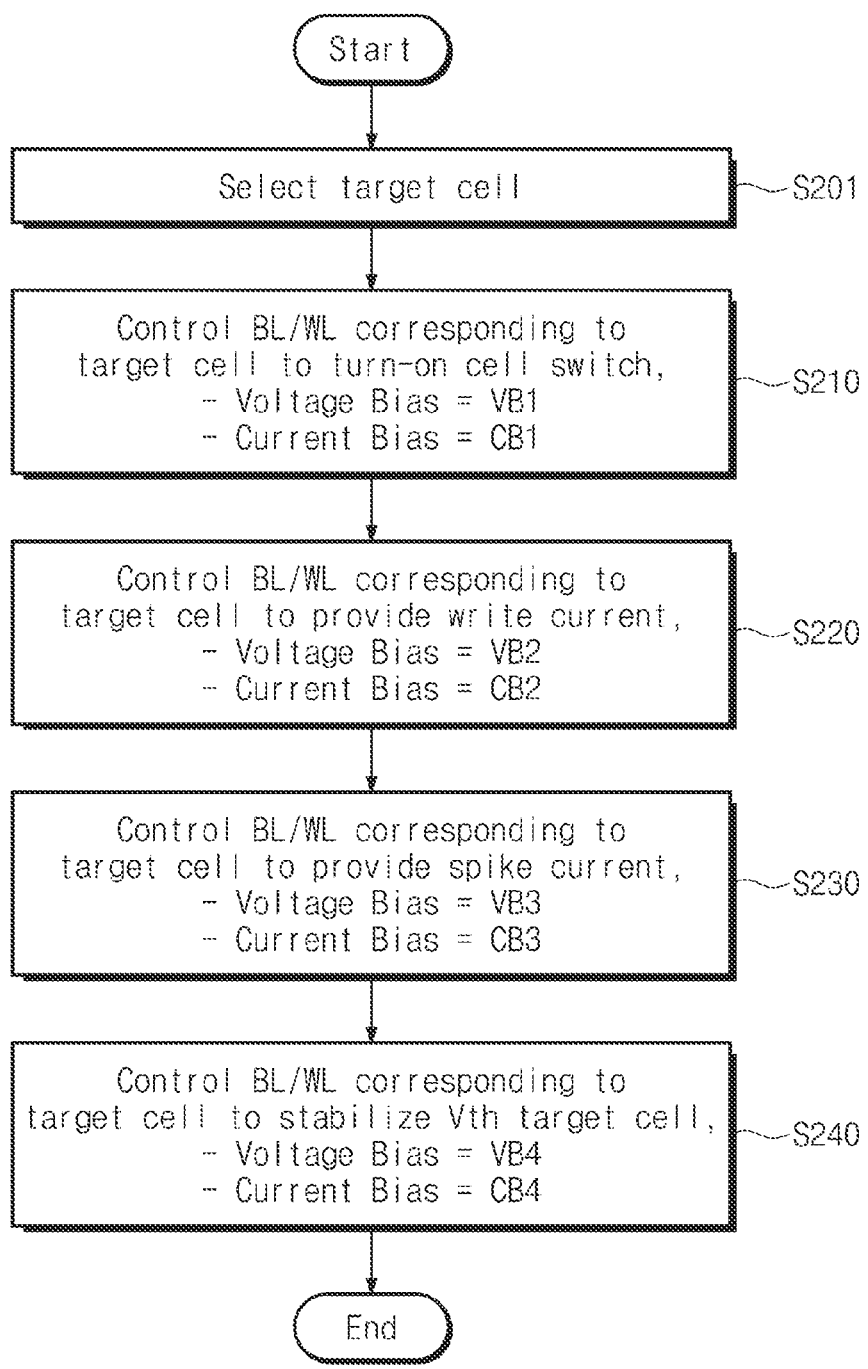
FIG. 10 is a flowchart illustrating an operation of a memory device of FIG. 1.

FIG. 10 is a flowchart illustrating an operation of a memory device of FIG. 1. Referring to FIGS. 1 and 10, the memory device 100 may perform operation S201, operation 210, operation S220, and operation S230. Operation S201, operation S210, operation S220, and operation S230 are similar to operation S101, operation S110, operation S120, and operation S130 of FIG. 5, and thus, additional description will be omitted to avoid redundancy.

After operation S230, in operation S240, the memory device 100 may control a bit line BL and a word line WL corresponding to a target memory cell such that a threshold voltage of the target memory cell is stabilized. For example, the memory device 100 may apply a fourth voltage bias VB4 between the bit line BL and the word line WL connected with the target memory cell and may apply a fourth current bias CB4 to the bit line BL connected with the target memory cell. In an embodiment, the fourth voltage bias VB4 may be lower than a lower limit value of a threshold voltage distribution of memory cells in the set state SET. An electric field may be applied to a target memory cell having the reset state RST through operation S240, and thus, a threshold voltage change of the target memory cell having the reset state RST may be stabilized.

As described above, immediately after the reset write operation is completely performed on the target memory cell, the fourth voltage bias VB4 may be applied to the bit line BL and the word line WL of the target memory cell. In this case, a threshold voltage change of the target memory cell may be stabilized through the electric field formed by the fourth voltage bias VB4.

Figure 11:
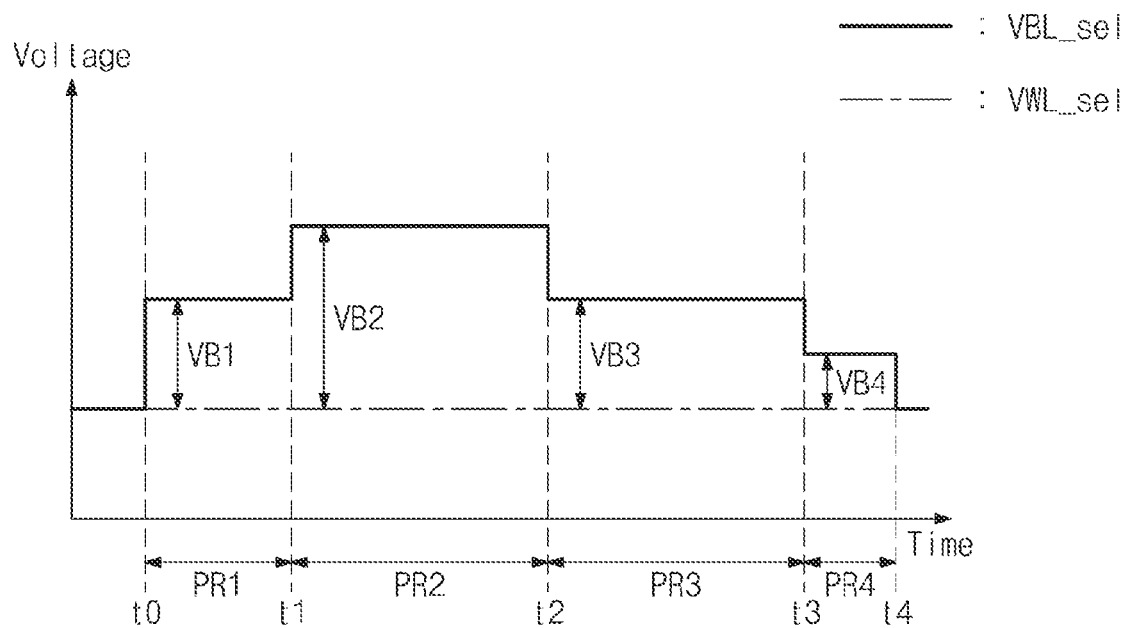
FIG. 11 is a timing diagram illustrating voltage biases according to an operation of a flowchart of FIG. 10.

FIG. 11 is a timing diagram illustrating voltage biases according to an operation of the flowchart of FIG. 10. In the timing diagram of FIG. 11, a horizontal axis represents time and a vertical axis represents a voltage. For brevity of drawing, in the timing diagram, a dash-single dotted line indicates the selection word line voltage VWL_sel and a solid line indicates the selection bit line voltage VBL_sel.

Referring to FIGS. 1, 10, and 11, the memory device 100 may perform the reset write operation by controlling a bit line and a word line of a target memory cell as illustrated in FIG. 11. For example, the memory device 100 may control the selection bit line voltage VBL_sel and the selection word line voltage VWL_sel through the first to third periods PR1 to PR3. The first to third periods PR1 to PR3 are the same as those described with reference to FIG. 8A, and thus, additional description will be omitted to avoid redundancy.

After the third period PR3, during a fourth period PR4 (i.e., from t3 to t4), the memory device 100 may decrease the selection bit line voltage VBL_sel such that a difference between the selection bit line voltage VBL_sel and the selection word line voltage VWL_sel is the fourth voltage bias VB4. That is, as the fourth voltage bias VB4 is applied to the bit line and the word line of the target memory cell during the fourth period PR4, a threshold voltage change of the target memory cell may be stabilized.

In an embodiment, the fourth voltage bias VB4 applied in the fourth period PR4 may be a voltage level lower than the first threshold voltage Vth1 (refer to FIG. 4B) indicating a threshold voltage of each memory cell in the set state SET. In an embodiment, the fourth voltage bias VB4 applied in the fourth period PR4 may be controlled in a multi-step manner That is, the fourth voltage bias VB4 may be controlled to increase or decrease stepwise or gradually during the fourth period PR4. A maximum value of the fourth voltage bias VB4 controlled in the multi-step manner may be a voltage level lower than the first threshold voltage Vth1 (refer to FIG. 4B) indicating a threshold voltage of each memory cell in the set state SET.

In an embodiment, how the selection bit line voltage VBL_sel and the selection word line voltage VWL_sel are controlled is described with reference to FIG. 11, but the present disclosure is not limited thereto. For example, the memory device 100 may control a voltage applied to a bit line and a word line of a target memory cell based on the method described with reference to FIGS. 8A to 8D or based on various other methods. In this case, voltage differences between a bit line and a word line in respective periods may be controlled to correspond to the first to fourth voltage biases VB1 to VB4, respectively.

Figure 12:
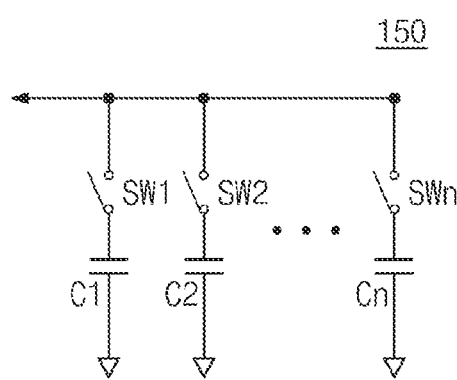
FIG. 12 is a circuit diagram illustrating a current bias circuit of FIG. 1.
Figure 13:
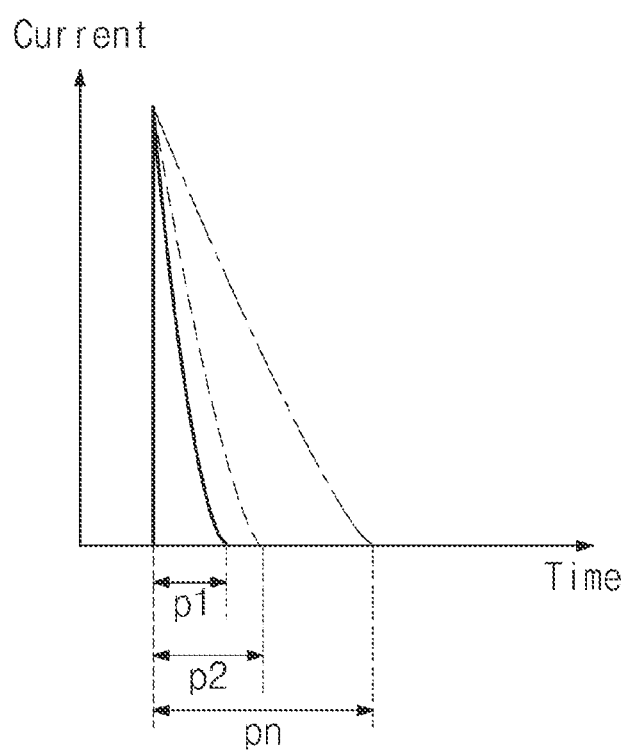
FIG. 13 is a timing diagram for describing an operation of a current bias circuit of FIG. 12.

FIG. 12 is a circuit diagram illustrating a current bias circuit of FIG. 1. FIG. 13 is a timing diagram for describing an operation of a current bias circuit of FIG. 12. In the timing diagram of FIG. 13, a horizontal axis represents time and a vertical axis represents a current flowing through a target memory cell. For convenience of description, one spike current (or one current pulse) is illustrated in FIG. 13. Referring to FIGS. 1, 12, and 13, the current bias circuit 150 may include a plurality of switches SW1 to SWn and a plurality of capacitors C1 to Cn. The plurality of switches SW1 to SWn may respectively correspond to the plurality of capacitors C1 to Cn to form a plurality of switch and capacitor pairs. The corresponding switch and the corresponding capacitor (or a switch and a capacitor of each of the plurality of switch and capacitor pairs) may be connected in series between a current bias (CB) node and a specific voltage node.

Each of the plurality of switches SW1 to SWn may be turned on or turned off under control of the control logic circuit 160. As the number of switches turned on from among the plurality of switches SW1 to SWn increases, a total capacitance value formed by the plurality of capacitors C1 to Cn may increase. As the total capacitance value increases, a time during which one spike current or one current pulse is maintained may increase.

For example, as illustrated in FIG. 13, in the case where "a" switches of the plurality of switches SW1 to SWn are turned on, one spike current may be maintained during a first time p1. In other words, one spike current may decrease from a peak value to "0" during the first time p1. In the case where "b" switches ("b" being more than "a") of the plurality of switches SW1 to SWn are turned on, one spike current may be maintained during a second time p2 longer than the first time p1. In the case where all the switches SW1 to SWn are turned on, one spike current may be maintained during an n-th time pn longer than the second time p2.

As described above, as a plurality of switches are controlled, a total capacitance value of the current bias circuit 150 may be adjusted, and a time during which one spike current is maintained or a time during which one spike current decreases from a peak value to "0" may be adjusted by the total capacitance value thus adjusted.

Figure 14:
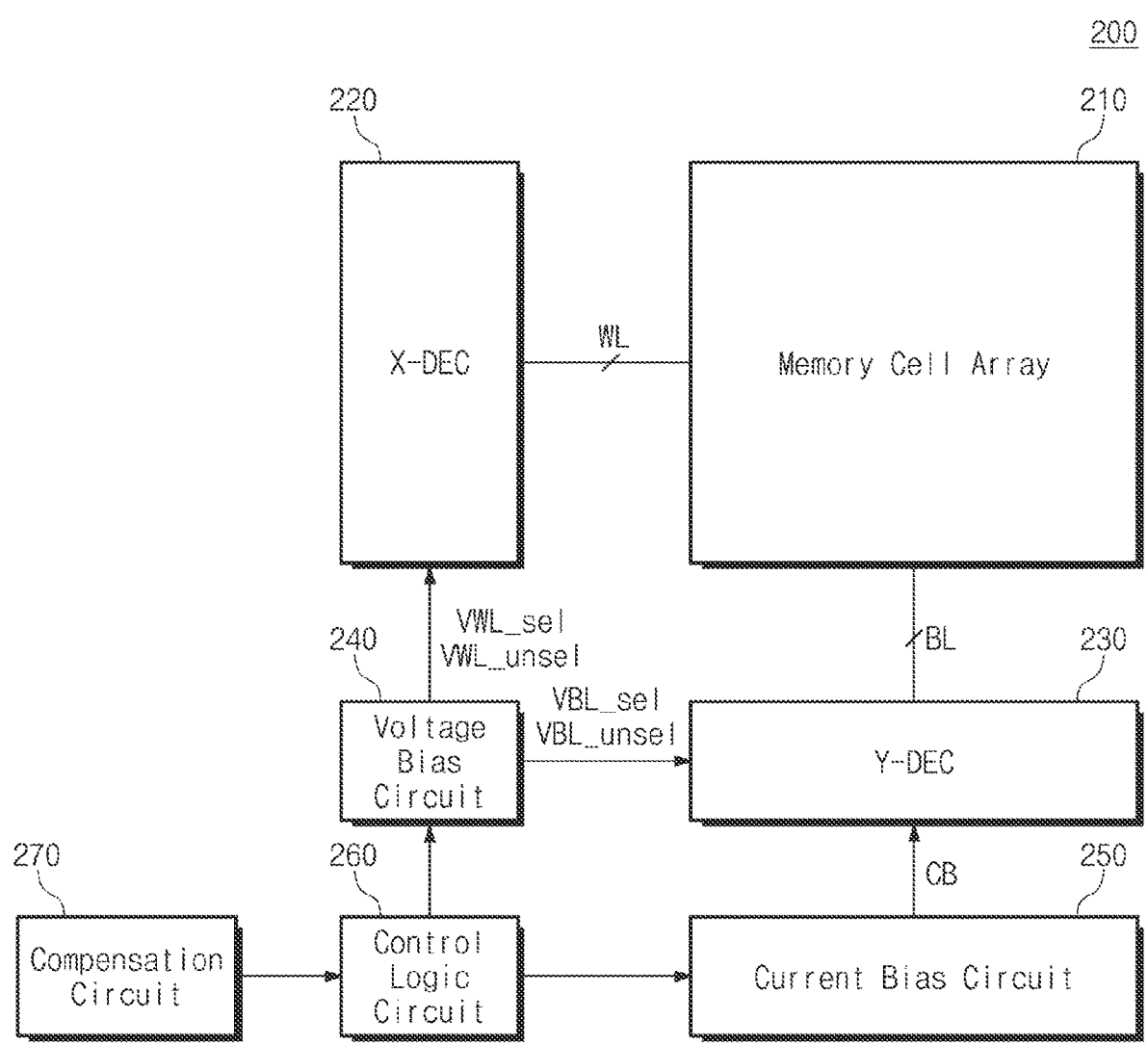
FIG. 14 is a block diagram illustrating a memory device according to an embodiment of the present disclosure.

FIG. 14 is a block diagram illustrating a memory device according to an embodiment of the present disclosure. Referring to FIG. 14, a memory device 200 may include a memory cell array 210, a row decoder (X-DEC) (hereinafter referred to as an "X-decoder") 220, a column decoder (Y-DEC) (hereinafter referred to as a "Y-decoder") 230, a voltage bias circuit 240, a current bias circuit 250, a control logic circuit 260, and a compensation circuit 270. The memory cell array 210, the X-decoder 220, the Y-decoder 230, the voltage bias circuit 240, the current bias circuit 250, and the control logic circuit 260 are described above, and thus, additional description will be omitted to avoid redundancy.

The memory device 200 of FIG. 14 may further include the compensation circuit 270. The compensation circuit 270 may perform various compensation operations of the memory device 200. For example, the compensation circuit 270 may be configured to control a voltage bias or a current bias to be applied to a target memory cell depending on a temperature of the memory device 200. In an embodiment, during a compensation operation, the voltage bias may be controlled by controlling the selection word line voltage VWL_sel, the non-selection word line voltage VWL_unsel, the selection bit line voltage VBL_sel, and the non-selection bit line voltage VBL_unsel. In an embodiment, during the compensation operation, the current bias may be controlled by controlling a total capacitance value of the current bias circuit 250.

For example, the compensation circuit 270 may perform a compensation operation on the voltage bias based on a temperature of the memory device 200. In the case where a temperature of the memory device 200 increases, a resistance on a path through which a write current flows may increase. In this case, the compensation circuit 270 may control the voltage bias based on positive temperature coefficient (PTC) temperature compensation. That is, as a temperature of the memory device 200 increases, temperature compensation may be performed on the voltage bias by increasing a magnitude of the voltage bias (e.g., a voltage difference of a word line and a bit line). Because a magnitude of a reset write current of a memory cell changes depending on a temperature, an offset according to a temperature change may be applied to the current bias.

In an embodiment, temperature information of the memory device 200 may be provided in the form of a temperature code or temperature data from a separate temperature detector and the compensation circuit 270 may be configured to determine an offset to be applied to the voltage bias and the current bias based on the temperature data or the temperature code.

In an embodiment, the compensation circuit 270 may be configured to perform location compensation depending on a location of a memory cell in the memory cell array 210 such that the voltage bias or the current bias is controlled. For example, in the case where a physical location of a target memory cell is distant from the X-decoder 220 and the Y-decoder 230, even though the same voltage bias and the same current bias are applied, a magnitude of a current flowing through the target memory cell or a magnitude of a voltage or a current affecting the target memory cell may decrease. That is, in the case where a physical location of a target memory cell is distant from the X-decoder 220 and the Y-decoder 230, the location compensation may be performed by applying an offset to each of the voltage bias and the current bias.

In detail, referring to the memory cell array 110 illustrated in FIG. 2, the memory cell MC31 may be a memory cell the closest to the X-decoder 120 and the Y-decoder 130 from among illustrated memory cells, and the memory cell MC13 may be a memory cell the most distant from the X-decoder 120 and the Y-decoder 130 among the illustrated memory cells. A distance of a memory cell from the X-decoder 120 and the Y-decoder 130 (i.e., a distance or a physical location of a memory cell) may correspond to a sum of a length of a word line between the memory cell and the X-decoder 120 and a length of a bit line between the memory cell and the Y-decoder 130. In an embodiment, a distance or a physical location of a memory cell may be determined based on address information.

As a distance of a target memory cell increases, an offset of the voltage bias may increase. That is, as a distance of a target memory cell increases, the location compensation may be performed by applying an increased offset to the voltage bias. In an embodiment, on the basis of a memory cell of the closest distance, a value of an offset to be applied as a distance increases may correspond to a product of a magnitude of a current flowing through a memory cell and a resistance value changing depending on a length increase of a word line and a bit line.

As described above, the memory device 200 according to an embodiment of the present disclosure may be configured to perform various compensation operations (e.g., temperature compensation, location combination, or a combination thereof) such that the voltage bias or the current bias is controlled. As such, the reliability of the memory device 200 may be improved.

Figure 15:
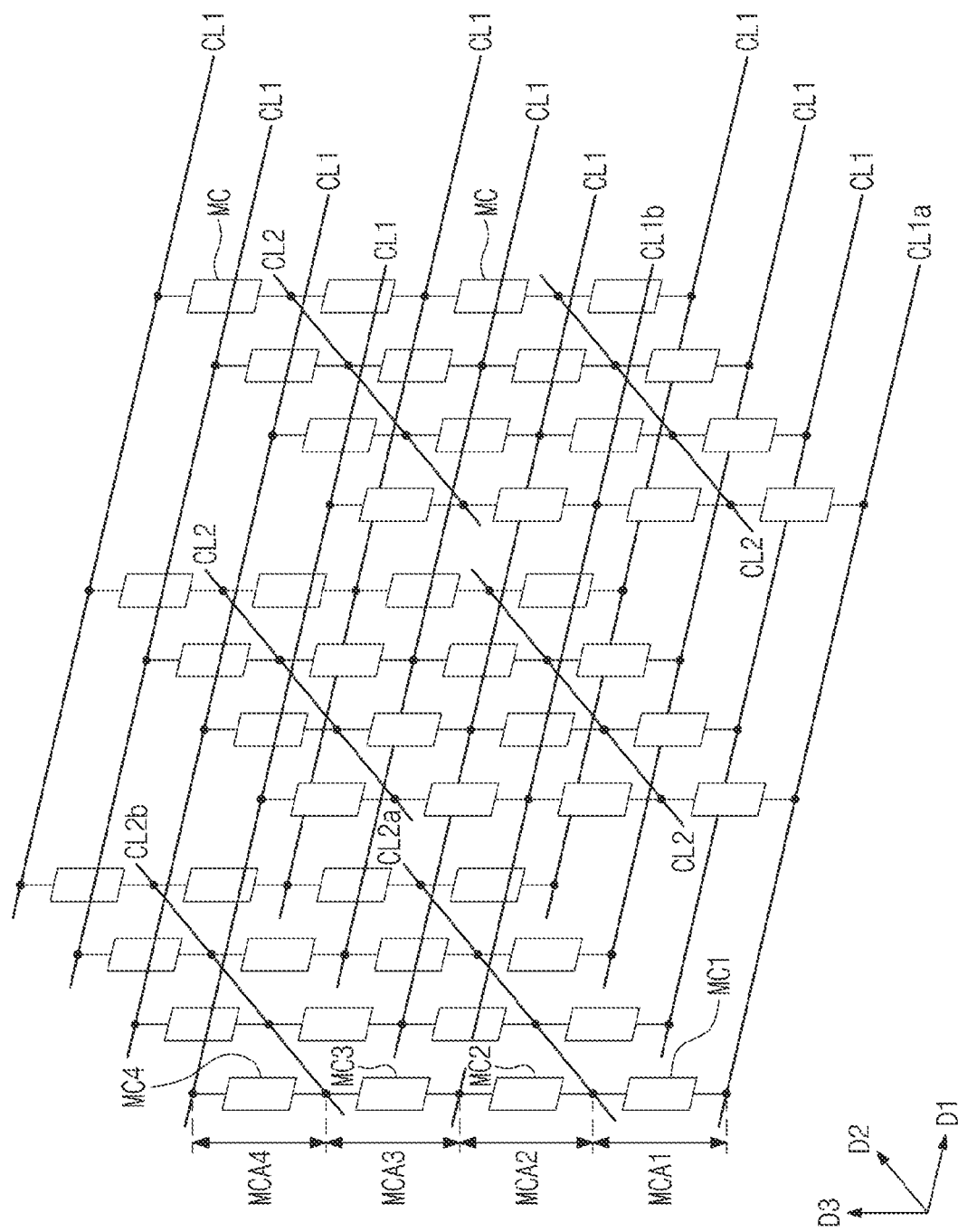
FIG. 15 is a circuit diagram illustrating a three-dimensional structure of a memory device according to an embodiment of the present disclosure.

FIG. 15 is a circuit diagram illustrating a three-dimensional structure of a memory device according to an embodiment of the present disclosure. Referring to FIG. 15, a memory device may be implemented in a three-dimensional stacked structure. For example, the memory device includes first to fourth memory cell array layers MCA1 to MCA4. The first to fourth memory cell array layers MCA1 to MCA4 may include a plurality of memory cells MC1, MC2, MC3, and MC4.

The first to fourth memory cell array layers MCA1 to MCA4 may be stacked in a third direction D3, and conductive lines CL1 and CL2 extending in a first direction D1 and a second direction D2 may be alternately formed between the first to fourth memory cell array layers MCA1 to MCA4. For example, the first conductive lines CL1 may extend in the first direction D1 and the second conductive lines CL2 may extend in the second direction D2. The first memory cell array layer MCA1 may be formed above the first conductive lines CL1, and the second conductive lines CL2 may be formed between the first and second memory cell array layers MCA1 and MCA2. The first conductive lines CL1 may be formed between the second and third memory cell array layers MCA2 and MCA3, and the second conductive lines CL2 may be formed between the third and fourth memory cell array layers MCA3 and MCA4. The first conductive lines CL1 may be formed above the fourth memory cell array layer MCA4. The first and second conductive lines CL1 and CL2 may be electrically connected with memory cells MC adjacent in the third direction D3.

In an embodiment, the first conductive line CL1 may be a bit line or a word line described with reference to FIGS. 1 to 14 and the second conductive line CL2 may be a word line or a bit line described with reference to FIGS. 1 to 14. For example, in the case where the first conductive lines CL1 are word lines and the second conductive lines CL2 are bit lines, the first and second memory cell array layers MCA1 and MCA2 may share bit lines, the second and third memory cell array layers MCA2 and MCA3 may share word lines, and the third and fourth memory cell array layers MCA3 and MCA4 may share bit lines.

In an embodiment, a target bit line and a target word line may be determined depending on a location of a target memory cell. For example, in the case where the first memory cell MC1 of the first memory cell array layer MCA1 is a target memory cell, conductive lines CL1a and CL2a may be selected as target lines and the selected target lines CL1a and CL2a may be controlled based on the method described with reference to FIGS. 1 to 14. In the case where the second memory cell MC2 of the second memory cell array layer MCA2 is a target memory cell, conductive lines CL2a and CL1b may be selected as target lines and the selected target lines CL2a and CL1b may be controlled based on the method described with reference to FIGS. 1 to 14. In the case where the third memory cell MC3 of the third memory cell array layer MCA3 is a target memory cell, conductive lines CL1b and CL2b may be selected as target lines and the selected target lines CL1b and CL2b may be controlled based on the method described with reference to FIGS. 1 to 14. That is, target lines may be determined depending on a location of a target memory cell and each of the selected target lines may be used as a bit line or a word line depending on a location of the target memory cell. However, the present disclosure is not limited thereto.

The memory device of the three-dimensional structure illustrated in FIG. 15 is an example, and the present disclosure is not limited thereto. For example, the number of memory cell array layers, the number of conductive lines, and the number of memory cells may increase or decrease depending on a way to implement a memory device.

Figure 16:
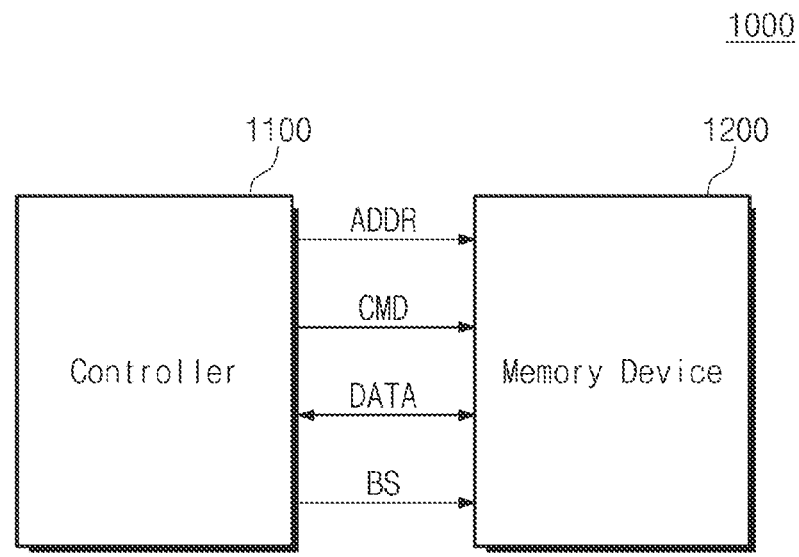
FIG. 16 is a block diagram illustrating a memory system including a memory device according to the present disclosure.

FIG. 16 is a block diagram illustrating a memory system including a memory device according to the present disclosure. Referring to FIG. 16, a memory system 1000 may include a controller 1100 and a memory device 1200. The controller 1100 may store data "DATA" in the memory device 1200 or may read the data "DATA" stored in the memory device 1200. For example, the controller 1200 may transmit an address ADDR, a command CMD, and the data "DATA" to the memory device 1200 to store the data "DATA" in the memory device 1200 or may transmit the address ADDR and the command CMD to the memory device 1200 to read the data "DATA" stored in the memory device 1200.

In an embodiment, the memory device 1200 may be the memory device 100 or 200 described with reference to FIGS. 1 to 15 or may operate based on the operation method described with reference to FIGS. 1 to 15. In an embodiment, the controller 1100 may provide bias information BS to the memory device 1200. The bias information BS may include information associated with various voltage biases and current biases described with reference to FIGS. 1 to 15. The memory device 1200 may be configured to store the data "DATA" based on the bias information BS.

In an embodiment, the memory system 1000 may be implemented with a memory module or a storage device and may store data under control of an external host. In this case, the controller 1100 may communicate with the external host through a given host interface. The host interface may comply with at least one of protocols for various interfaces such as a SATA (Serial ATA) interface, a PCIe (Peripheral Component Interconnect Express) interface, an SAS (Serial Attached SCSI) interface, an NVMe (Nonvolatile Memory express) interface, and a UFS (Universal Flash Storage) interface.

In an embodiment, the controller 1100 may communicate with the memory device 1200 through a given memory interface. The given memory interface may include a high-speed interface such as a DDR4.0 interface or a DDR-T interface.

Figure 17:
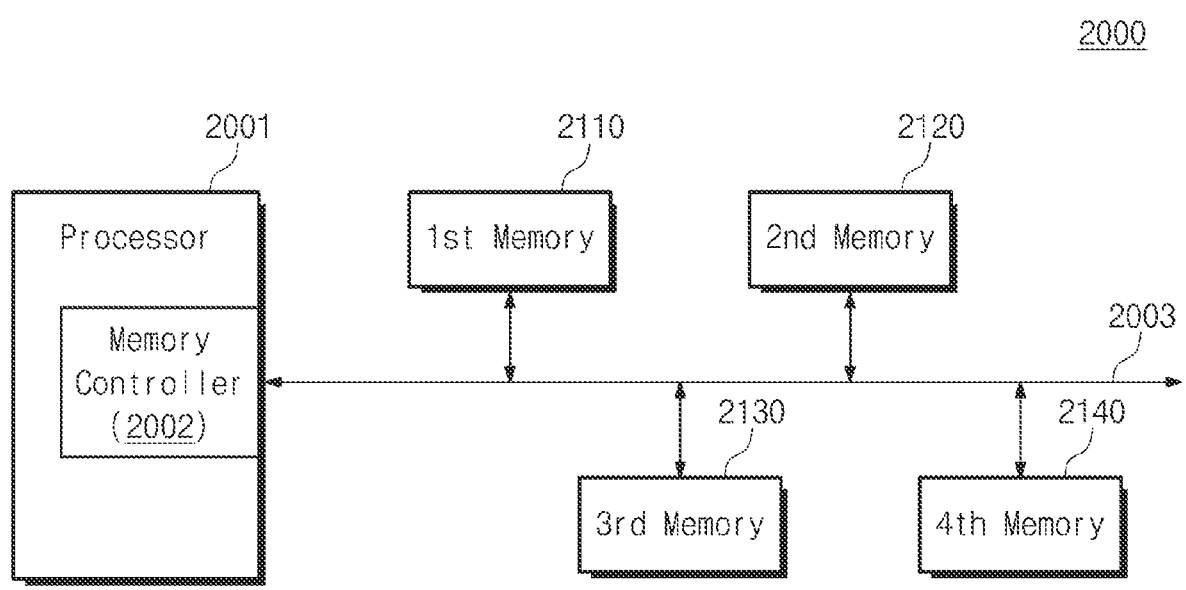
FIG. 17 is a block diagram illustrating a user system to which a memory device according to the present disclosure is applied.

FIG. 17 is a block diagram illustrating a user system to which a memory device according to the present disclosure is applied. Referring to FIG. 17, a user system 2000 may include a processor 2001 and a plurality of memories 2110 to 2140.

The processor 2001 may include a memory controller 2002. The memory controller 2002 may communicate with the plurality of memories 2110 to 2140 through a bus 2003. In an embodiment, the bus 2003 may include dedicated buses that are respectively connected with the plurality of memories 2110 to 2140 or a common bus shared by the plurality of memories 2110 to 2140.

In an embodiment, at least a part of the plurality of memories 2110 to 2140 may be the memory device 100, 200, or 1200 described with reference to FIGS. 1 to 16 or may operate based on the operation method described with reference to FIGS. 1 to 16.

In an embodiment, at least a part of the plurality of memories 2110 to 2140 may include a phase change memory described with reference to FIGS. 1 to 16, and the remaining memories may include a different kind of memory (e.g., a DRAM, a NAND flash memory, or an MRAM).

According to the present disclosure, a memory device may make a target memory cell have a reset state by applying at least one current pulse to the target memory cell. In this case, the at least one current pulse is a current pulse generated by a physical characteristic of a switching element (e.g., an OTS). Accordingly, because an application time of a reset write current decreases, the degradation of phase change memory cells included in the memory device may be reduced. In addition, because a threshold voltage of a phase change memory cell is finely adjusted by at least one current pulse, the reliability of the memory device may be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
a first phase change memory cell connected between a first bit line and a first word line;
an X-decoder configured to provide a selection word line voltage to the first word line during a reset write operation for changing a state of the first phase change memory cell from a set state to a reset state;
a Y-decoder configured to provide a selection bit line voltage to the first bit line during the reset write operation; and
a voltage bias circuit configured to:
generate the selection word line voltage and the selection bit line voltage based on a first voltage bias during a first period of the reset write operation,
generate the selection word line voltage and the selection bit line voltage based on a second voltage bias greater than the first voltage bias during a second period of the reset write operation, and
generate the selection word line voltage and the selection bit line voltage based on a third voltage bias smaller than the first voltage bias and the second voltage bias during a third period of the reset write operation.

2. The memory device of claim 1, further comprising a current bias circuit configured to:
provide a first current bias to the first bit line during the first period of the reset write operation;
provide a second current bias to the first bit line during the second period of the reset write operation; and
provide a third current bias to the first bit line during the third period of the reset write operation.

3. The memory device of claim 2, wherein:
the current bias circuit includes a plurality of switches and a plurality of capacitors, and
each of the plurality of switches and each of the plurality of capacitors are connected between an output node, from which the first to third current biases are respectively output in the first to third periods, and a specific voltage.

4. The memory device of claim 3, further comprising a control logic circuit configured to control the plurality of switches.

5. The memory device of claim 2, wherein:
the first current bias corresponds to a magnitude of a set write current,
the second current bias corresponds to a magnitude of a reset write current, and
the third current bias is equal to or smaller than a magnitude of a hold current, which is a minimum current for maintaining a turn-on state of the first phase change memory cell.

6. The memory device of claim 1, wherein the first phase change memory cell includes:
an ovonic threshold switch (OTS) connected with the first bit line; and
a phase change material (GST) connected between the ovonic threshold switch and the first word line.

7. The memory device of claim 1, wherein the first phase change memory cell includes:

an ovonic threshold switch (OTS) connected with the first word line; and a phase change material (GST) connected between the ovonic threshold switch and the first bit line.

8. The memory device of claim 1, wherein the first bit line extends in a first direction and the first word line extends in a second direction perpendicular to the first direction.

9. The memory device of claim 8, further comprising a second phase change memory cell stacked above the first phase change memory cell in a direction perpendicular to a plane defined by the first direction and the second direction and connected with the first bit line and a second word line extending in the second direction.

10. The memory device of claim 1, further comprising a compensation circuit configured to apply an offset, which is determined based on a temperature of the memory device or a physical location of the first phase change memory cell, to each of the first to third voltage biases.

\* \* \* \* \*